United States Patent
Park

(10) Patent No.: US 8,625,351 B2
(45) Date of Patent: Jan. 7, 2014

(54) NONVOLATILE MEMORY DEVICES

(75) Inventor: Jongyeol Park, Goyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 26 days.

(21) Appl. No.: 13/290,687

(22) Filed: Nov. 7, 2011

(65) Prior Publication Data

US 2012/0163081 A1    Jun. 28, 2012

(30) Foreign Application Priority Data

Dec. 23, 2010 (KR) .......................... 10-2010-0133498

(51) Int. Cl.
*G11C 11/34* (2006.01)

(52) U.S. Cl.
USPC ................................ 365/185.17; 365/185.18

(58) Field of Classification Search
USPC .................. 365/185.17, 185.09, 185.11, 104, 365/185.18
See application file for complete search history.

(56) References Cited

U.S. PATENT DOCUMENTS

| | | | |
|---|---|---|---|
| 6,212,097 B1 * | 4/2001 | Kihara et al. ............ | 365/185.04 |
| 7,570,526 B2 | 8/2009 | Han | |
| 2003/0161184 A1 * | 8/2003 | Lee et al. ................... | 365/185.3 |
| 2004/0257874 A1 * | 12/2004 | Tanaka et al. ............. | 365/185.09 |
| 2006/0186446 A1 * | 8/2006 | Kim et al. .................. | 257/296 |
| 2006/0245259 A1 * | 11/2006 | Fukuda et al. ............ | 365/185.22 |
| 2007/0252201 A1 * | 11/2007 | Kito et al. .................. | 257/331 |
| 2008/0112240 A1 | 5/2008 | Han | |
| 2008/0253192 A1 * | 10/2008 | Tokiwa ..................... | 365/185.18 |
| 2009/0121271 A1 * | 5/2009 | Son et al. ................... | 257/315 |
| 2009/0310425 A1 * | 12/2009 | Sim et al. .................. | 365/185.29 |

FOREIGN PATENT DOCUMENTS

| | | |
|---|---|---|
| JP | 2009176386 A | 8/2009 |
| KR | 10-0865824 B1 | 10/2008 |
| KR | 20090007859 A | 1/2009 |

* cited by examiner

*Primary Examiner* — Douglas King
(74) *Attorney, Agent, or Firm* — Harness, Dickey & Pierce, P.L.C.

(57) ABSTRACT

Nonvolatile memory devices including a memory cell array with a plurality of memory blocks and a plurality of bit lines arranged at the memory cell array. Each of the plurality of memory blocks may include a plurality of strings arranged in rows and columns and formed to be vertical to a substrate. Strings of each row of each memory block are connected with the bit lines, respectively, and strings of each column of each memory block are connected in common with a corresponding one of the bit lines. One memory block of the plurality of memory blocks includes a first region for storing ROM data and a second region for storing replica ROM data for repairing the ROM data.

21 Claims, 26 Drawing Sheets

Host

Storage

NONVOLATILE MEMORY DEVICES

CROSS-REFERENCE TO RELATED APPLICATION

This application claims priority under 35 U.S.C. §119, of Korean Patent Application No. 10-2010-0133498, filed Dec. 23, 2010, in the Korean Intellectual Property Office (KIPO), the entire contents of which is incorporated herein by reference.

BACKGROUND

1. Field

Example embodiments relate to nonvolatile semiconductor memory devices.

2. Description of the Related Art

Semiconductor memories are usually considered to be the most vital microelectronic component of digital logic system design, such as computers and microprocessor-based applications ranging from satellites to consumer electronics. Therefore, advances in the fabrication of semiconductor memories including process enhancements and technology developments through the scaling for higher densities and faster speeds help establish performance standards for other digital logic families.

Semiconductor memory devices may be characterized as volatile random access memories (RAMs), or nonvolatile memory devices. In RAMs, the logic information is stored either by setting up the logic state of a bistable flip-flop such as in a static random access memory (SRAM), or through the charging of a capacitor as in a dynamic random access memory (DRAM). In either case, the data is stored and can be read out as long as the power is applied, and are lost when the power is turned off; hence, they are called volatile memories.

Nonvolatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of storing the data, even with the power turned off. The nonvolatile memory data storage mode may be permanent or reprogrammable, depending upon the fabrication technology used. Nonvolatile memories are used for program and microcode storage in a wide variety of applications in the computer, avionics, telecommunications, and consumer electronics industries. A combination of single-chip volatile as well as nonvolatile memory storage modes is also available in devices such as nonvolatile SRAM (nvS-RAM) for use in systems that require fast, programmable nonvolatile memory. In addition, dozens of special memory architectures have evolved which contain some additional logic circuitry to optimize their performance for application-specific tasks.

In nonvolatile memories, however, MROM, PROM, and EPROM are not free to be erased and written to by a system itself, so that it is not easy for general users to update stored contents. On the other hand, EEPROM is capable of being electrically erased or written. Application of an EEPROM is widened to an auxiliary memory or to system programming where continuous updates are needed (flash EEPROM).

SUMMARY

According to example embodiments of the inventive concepts a nonvolatile memory devices includes a memory cell array having a plurality of memory blocks and a plurality of bit lines arranged at the memory cell array. Each of the plurality of memory blocks has a plurality of strings arranged in rows and columns and formed to be vertical to a substrate. Strings of each row of each memory block are connected with the bit lines, respectively, and strings of each column of each memory block are connected in common with a corresponding one of the bit lines. One memory block of the plurality of memory blocks includes a first region for storing ROM data and a second region for storing replica ROM data for repairing the ROM data.

According to at least one example embodiment, the first region is formed of strings of one of rows in the one memory block and the second region is formed of strings of one of the remaining rows in the one memory block. According to at least one example embodiment, read and program operations on strings of the first region are executed to be independent from strings of the second region. According to at least one example embodiment, each of the strings of the first region includes memory cells connected with word lines, memory cells of two word lines of the word lines store the ROM data, and memory cells of the remaining word lines have an erase state.

According to at least one example embodiment, at least one of the remaining word lines is disposed between the two word lines. According to at least one example embodiment, at a read operation, the two word lines are driven by a ground voltage, and the remaining word lines other than the two word lines are driven by a read voltage. According to at least one example embodiment, at a read operation, the two word lines are driven by a ground voltage, word lines adjacent to the two word lines are driven by a voltage higher than a read voltage, and the remaining word lines are driven by the read voltage.

According to other example embodiments of the inventive concepts a data storage device includes a nonvolatile memory device and a controller configured to control the nonvolatile memory device. The nonvolatile memory device includes a memory cell array having a plurality of memory blocks and a plurality of bit lines arranged at the memory cell array. Each of the plurality of memory blocks has a plurality of strings arranged in rows and columns and formed to be vertical to a substrate. One memory block of the plurality of memory blocks includes a first region for storing ROM data and a second region for storing replica ROM data for repairing the ROM data.

According to at least one example embodiment, strings of each row of each memory block are connected with the bit lines, respectively, and strings of each column of each memory block are connected in common with a corresponding one of the bit lines. According to at least one example embodiment, the first region is formed of strings of one of rows in the one memory block and the second region is formed of strings of one of the remaining rows in the one memory block. According to at least one example embodiment, read and program operations on strings of the first region are executed to be independent from strings of the second region.

According to at least one example embodiment, each of the strings of the first region includes memory cells connected with word lines, memory cells of two word lines of the word lines store the ROM data, and memory cells of the remaining word lines have an erase state. According to at least one example embodiment, at least one of the remaining word lines is disposed between the two word lines. According to at least one example embodiment, at a read operation, the two word lines are driven by a ground voltage, and the remaining word lines other than the two word lines are driven by a read voltage. According to at least one example embodiment, at a read operation, the two word lines are driven by a ground voltage, word lines adjacent to the two word lines are driven by a voltage higher than a read voltage, and the remaining word lines are driven by the read voltage.

According to still other example embodiments of the inventive concepts a solid state drive includes a storage medium having a plurality of nonvolatile memory devices and a controller connected with the storage medium via a plurality of channels and configured to control the storage medium. Each of the nonvolatile memory devices includes a memory cell array having a plurality of memory blocks and a plurality of bit lines arranged at the memory cell array. Each of the plurality of memory blocks has a plurality of strings arranged in rows and columns and formed to be vertical to a substrate, one memory block of the plurality of memory blocks including a first region for storing ROM data and a second region for storing replica ROM data for repairing the ROM data.

According to at least one example embodiment, strings of each row of each memory block are connected with the bit lines, respectively, and strings of each column of each memory block are connected in common with a corresponding one of the bit lines, the first region is formed of strings of one of rows in the one memory block, and the second region is formed of strings of one of the remaining rows in the one memory block. According to at least one example embodiment, read and program operations on strings of the first region are executed to be independent from strings of the second region.

According to at least one example embodiment, each of the strings of the first region includes memory cells connected with word lines, memory cells of two word lines of the word lines store the ROM data, memory cells of the remaining word lines have an erase state, and at least one of the remaining word lines is disposed between the two word lines. According to at least one example embodiment, at a read operation, the two word lines are driven by a ground voltage, and the remaining word lines other than the two word lines are driven by a read voltage.

According to at least one example embodiment, a nonvolatile memory device includes at least one vertical channel memory block including read-only-memory (ROM) data and replica ROM data.

According to at least one example embodiment, a solid state drive includes a storage medium including a plurality of nonvolatile memory devices, each of the nonvolatile memory devices including a memory cell array with a plurality of memory blocks and a plurality of bit lines connected to the memory cell array, each of the plurality of memory blocks including a plurality of strings arranged in rows and columns, the strings being vertical to a substrate, at least one memory block of the plurality of memory blocks including a read-only-memory (ROM) data region and a replica ROM data region, and a controller connected with the storage medium via a plurality of channels.

According to at least one example embodiment, a data storage device includes a nonvolatile memory device including a memory cell array with a plurality of memory blocks, each of the plurality of memory blocks including a plurality of strings arranged in rows and columns, the strings being vertical to a substrate, at least one memory block of the plurality of memory blocks including a read-only-memory ROM data region and a replica ROM data region, a plurality of bit lines connected to the memory cell array, and a controller configured to control the nonvolatile memory device.

According to at least one example embodiment, a nonvolatile memory device includes a memory cell array including a plurality of memory blocks, each of the plurality of memory blocks including strings arranged in rows and columns, the strings being vertical to a substrate, at least one memory block of the plurality of memory blocks including a read-only-memory (ROM) data region and a replica ROM data region, and a plurality of bit lines connected to the memory cell array, strings of each of the rows connected with the bit lines, and strings of each of the columns connected in common with a corresponding one of the bit lines.

BRIEF DESCRIPTION OF THE FIGURES

Example embodiments will be more clearly understood from the following brief description taken in conjunction with the accompanying drawings.

FIG. 1 is a block diagram illustrating nonvolatile memory devices according to example embodiments of the inventive concepts;

FIG. 2 includes a block diagram and a circuit schematic illustrating memory cell arrays according to example embodiments of the inventive concepts;

FIG. 3 is a circuit diagram illustrating a bias condition for reading ROM data stored in a ROM block of FIG. 2;

FIG. 4 is a perspective diagram illustrating memory cell arrays according to other example embodiments of the inventive concepts;

FIG. 5 is a perspective view of a memory block of FIG. 1;

FIG. 6 is a cross-sectional view taken along a line VI-VI' of FIG. 5;

FIG. 7 is a cross sectional diagram of a transistor structure TS in FIG. 6;

FIG. 8 is a circuit diagram illustrating an equivalent circuit of a memory block of FIG. 5 according to at least one example embodiment of the inventive concepts;

FIG. 9 is a circuit diagram illustrating a bias condition for reading ROM data stored in a memory block of FIG. 8;

FIGS. 10-13 are circuit diagrams illustrating equivalent circuits of a memory block of FIG. 5 according to some example embodiments of the inventive concepts;

FIG. 14 is a perspective view illustrating a part of a memory block of FIG. 4 according to still other example embodiments of the inventive concepts;

FIG. 15 is a block diagram illustrating data storage devices including a nonvolatile memory device according to at least one example embodiment of the inventive concepts;

FIG. 16 is a block diagram illustrating controllers according to at least one example embodiment of the inventive concepts;

FIG. 17 is a block diagram illustrating solid state drives using a nonvolatile memory device according to example embodiments of the inventive concepts;

FIG. 18 is a block diagram illustrating a storage using a solid state drive of FIG. 17;

FIG. 19 is a block diagram illustrating storage servers using a solid state drive of FIG. 17;

FIGS. 20-22 are diagrams illustrating systems to which a data storage device according to example embodiments of the inventive concept may be applied; and FIGS. 23-27 are diagrams illustrating other systems to which a data storage device according to example embodiments of the inventive concepts may be applied.

Figure 1:
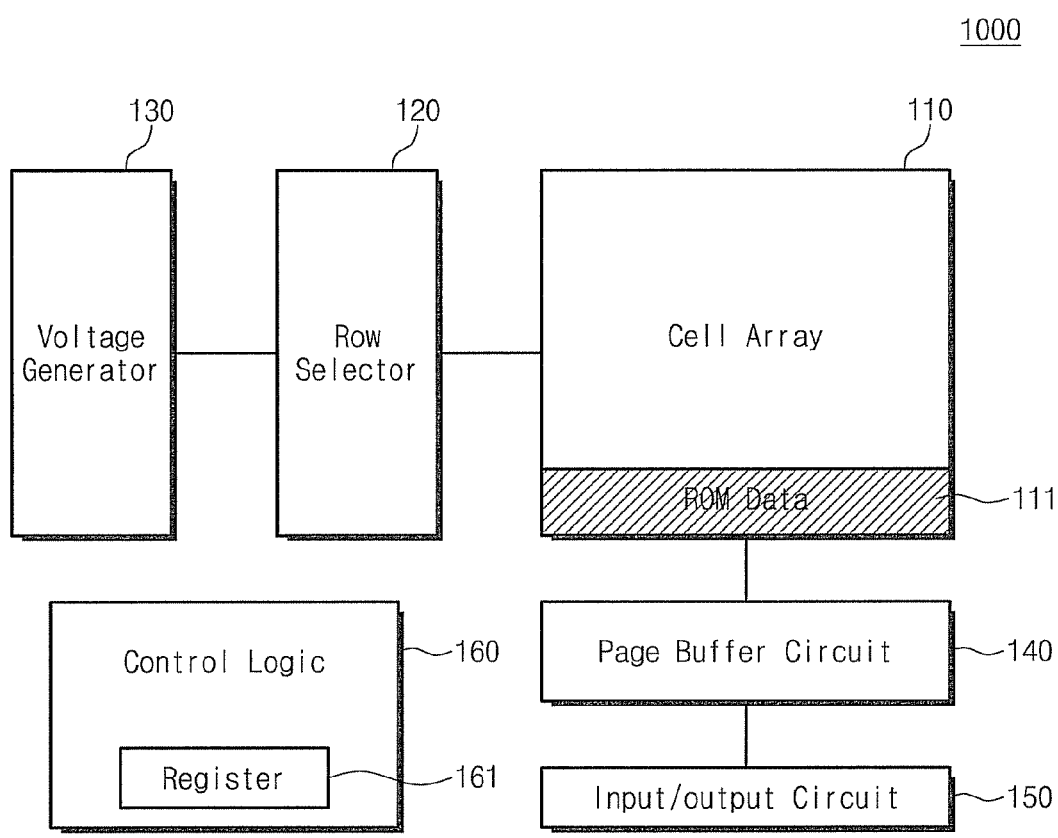
FIGS. 1-27 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully hereinafter with reference to the accompanying drawings, in which example embodiments are shown. Example embodiments may, however, be embodied in many different forms and should not be construed as limited to the embodiments set forth herein; rather, these embodiments are provided so that this disclosure will be thorough and complete, and will fully convey the concept of example embodiments to those of ordinary skill in the art. Like reference numerals in the drawings denote like elements, and thus their description will be omitted.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element is referred to as being "connected", "coupled to" another element, it can be directly connected or coupled to the other element or intervening elements may be present. In contrast, when an element is referred to as being "directly connected to" or "directly coupled to" another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath", "below", "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises," "comprising," "includes" and/or "including" if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly-used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram illustrating nonvolatile memory devices according to example embodiments of the inventive concepts. Referring to FIG. 1, a nonvolatile memory device 1000 according to example embodiments may include a memory cell array 110 which may store data. The memory cell array 110 may be at least one of a planar structure and a vertical structure. The memory cell array 110 may include a region 111 for storing ROM data. The region 111 may be called a trim data region, an OTP region, an E-fuse region, an information region, and/or the like. Hereinafter, the region 111 may be referred to as a ROM data region. The ROM data region 111 may be a one-time programmable region, and ROM data stored in the ROM data region 111 may be read when needed. The term 'ROM data' may be read-only data. ROM data (or, reliability data) stored in the ROM data region 111 may include, for example, operating option information, voltage trimming information, repair information and/or the like. However, ROM data stored in the ROM data region 111 is not limited according to example embodiments.

The nonvolatile memory device 1000 according to at least one example embodiment may include a row selector circuit 120, a voltage generator circuit 130, a page buffer circuit 140, an input/output circuit 150, and control logic 160. The row selector circuit 120 may select and drive rows of the memory cell array 110 in response to the control of the control logic 160. The voltage generator circuit 130 may generate voltages (e.g., a word line voltage, a bulk voltage, and/or the like) necessary for operations (e.g., erasing, reading, programming, and/or the like) in response to the control of the control logic 160. A voltage that may be generated by the voltage generator circuit 130 may be supplied to the memory cell array 110 via the row selector circuit 120 or directly.

The page buffer circuit 140 may operate in response to the control of the control logic 160, and may be configured to read data from the memory cell array 110 at a read operation and to program data in the memory cell array 110 at a program operation. The input/output circuit 150 may provide an interface with the interior of the nonvolatile memory device 1000 and/or with an external device (e.g., a memory controller). Although not shown in FIG. 1, the input/output circuit 150 may include a column selector circuit, an input buffer circuit, an output buffer circuit, and/or the like.

The control logic 160 may control an overall operation of the nonvolatile memory device 1000. The control logic 160 may include a register 161 which may be configured to a part or all of ROM data read from the ROM data region 111 via the page buffer circuit 140. Loading of ROM data onto the register 161 may be made at power-up. The control logic 160 may control an overall operation of the nonvolatile memory device 1000 according to an operating option that may be defined by the ROM data that may be stored in the register 161. In the event that repair information may be stored in the register 161, the control logic 160 may control the input/output circuit 150 such that replaced data may be transferred instead of defective data. If voltage trimming information is stored in the register 161, the control logic 160 may control the voltage generator circuit 130 based upon the voltage trimming information.

Figure 2:
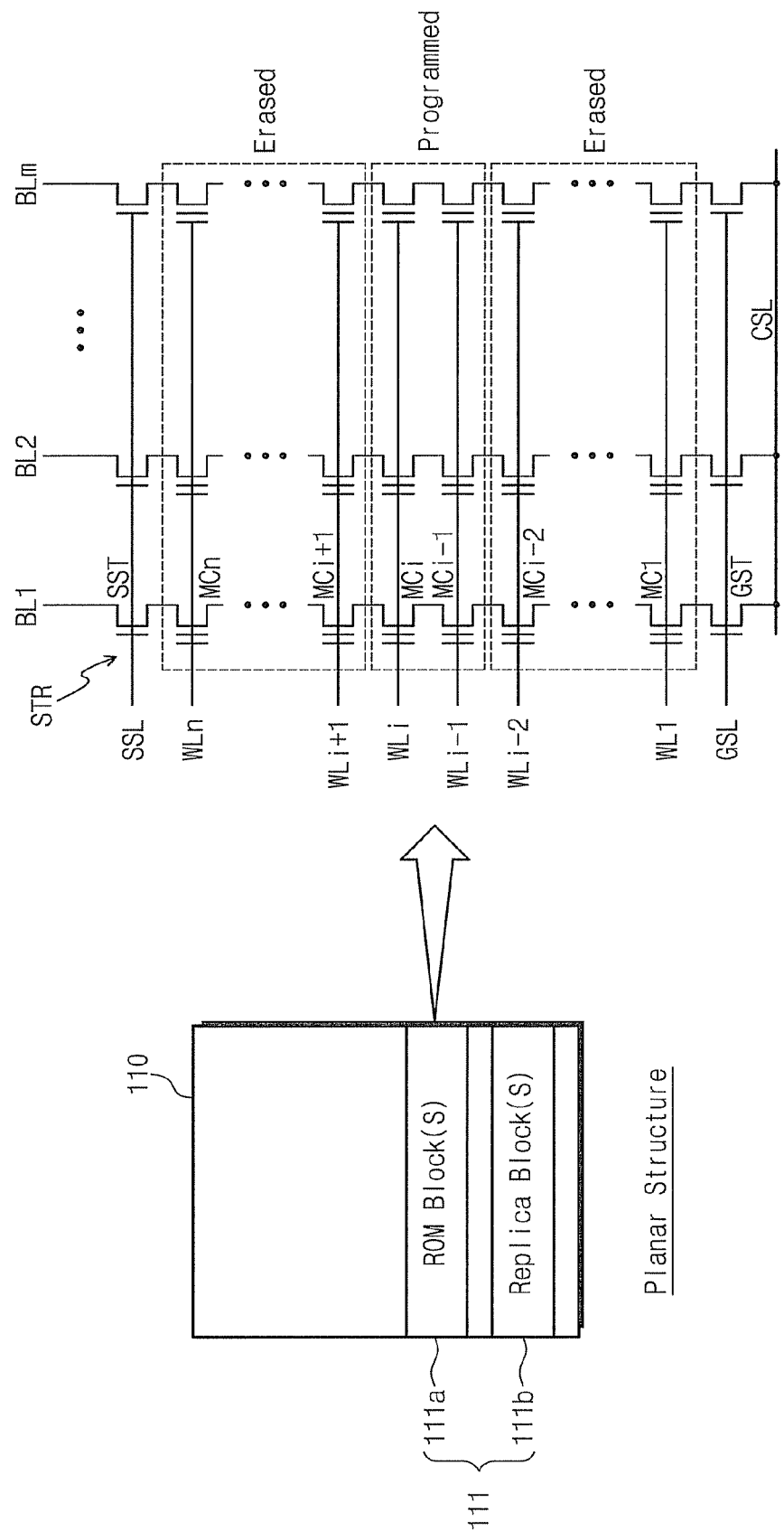

FIG. 2 includes a block diagram and a circuit schematic illustrating memory cell arrays according to example embodiments of the inventive concepts. A memory cell array according to at last one example embodiment may be a planar structure. With the planar structure, strings may be formed in parallel with a substrate. Referring to FIG. 2, the memory cell array 110 may include a ROM data region 111. The ROM data region 111 may include one or more ROM blocks 111a for storing ROM data and one or more replica blocks 111b for storing the same data as the ROM data stored in the ROM block 111a. It may be understood that two or more ROM blocks may be used according to the amount of ROM data. The number of replica blocks may be determined according to the number of ROM blocks. More replica blocks may be used to prepare for frequent read fail. The replica block 111b may be used to repair read fail when read fail on ROM data that may be stored in the ROM block 111a arises. For this reason, the same data as ROM data that may be stored in the ROM block 111a may be stored in the replica block 111b.

The ROM block 111a, for example, may include strings STR corresponding to a plurality of bit lines BL1-BLm, respectively. Each string STR may include a string selection transistor SST, a ground selection transistor GST, and memory cells MC1-MCn that may be connected in series between the selection transistors SST and GST. The string selection transistor SST, the ground selection transistor GST, and the memory cells MC1 to MCn may be connected with a string selection line SSL, a ground selection line GSL, and word lines WL1-WLn, respectively. The ground selection transistor may be connected to a common source line CSL. Although not shown in figures, the replica block 111b may be configured the same as the ROM block 111a.

Two word lines (e.g., WLi-1 and WLi) of the word lines WL1-WLn of the ROM block 111a may be used to store ROM data. Memory cells connected with the word lines WLi-1 and WLi may be programmed according to ROM data. Memory cells that may be connected with the remaining word lines may keep an erase state. Memory cells (e.g., MCi-1 and MCi) in each column and that may be connected with the word lines WLi-1 and WLi may be programmed to have the same data bit (e.g., data '1' or data '0'). This may prepare for data fail due to charge loss.

Figure 3:
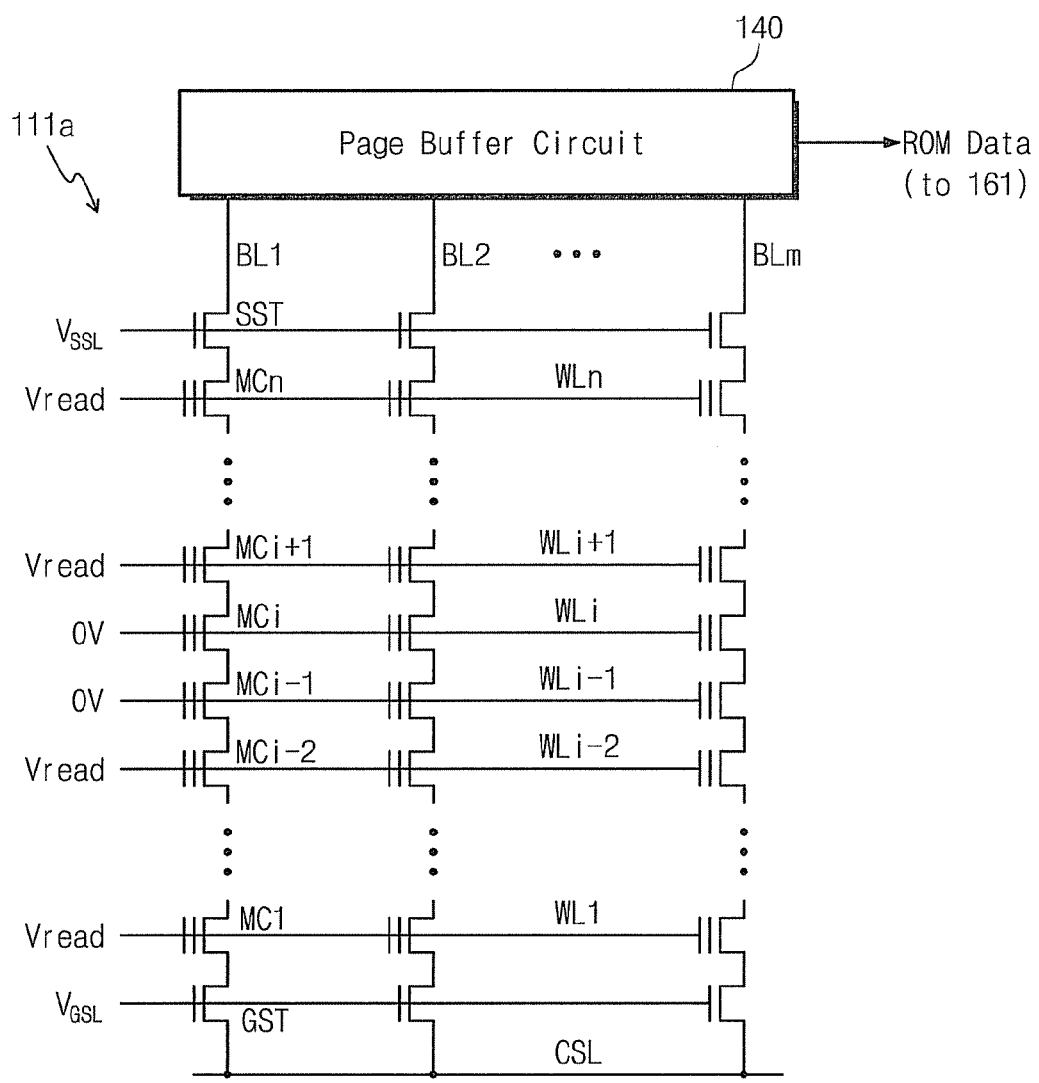

FIG. 3 is a circuit diagram illustrating a bias condition for reading ROM data stored in a ROM block of FIG. 2. ROM data that may be stored in a ROM block 111a, for example, may be read by a page buffer circuit 140 under the control of control logic 160. As illustrated in FIG. 3, the ROM data may be read by applying, for example, a voltage of 0V to word lines WLi-1 and WLi and a read voltage Vread to the remaining word lines WL1 to WLi-2 and WLi+2 to WLn. $V_{GSL}$ may be applied to a ground selection transistor GST and $V_{SSL}$ may be applied to a string selection transistor SST. Although one of memory cells MCi+1 and MCi in any column (e.g., BL1) and that may be connected with the word lines WLi-1 and WLi may cause data fail due to charge loss, ROM data that may be stored in the other memory cell may be read normally. The read ROM data may be stored in a register 161 of the control logic 160 via an input/output circuit 150.

Figure 4:
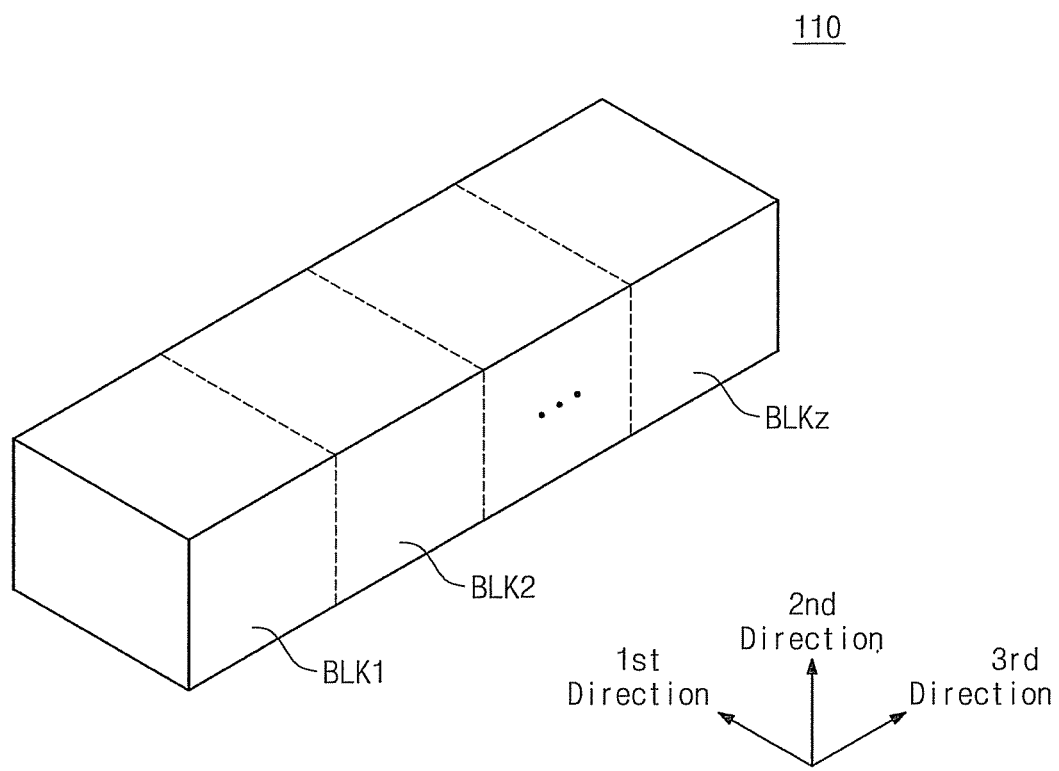

FIG. 4 is a perspective diagram illustrating memory cell arrays according to other example embodiments of the inventive concepts. A memory cell array according to at least one example embodiment may be a vertical structure. The vertical structure may be a structure in which a string of memory cells is arranged vertically with respect to a substrate. For example, memory cells of a memory string may be stacked vertically. Referring to FIG. 4, a memory cell array 110 may include a plurality of memory blocks BLK1-BLKz, each of which may be a three-dimensional structure (a vertical structure). For example, each of the memory blocks BLK1-BLKz may include structures extending along the first to third directions. For example, each of the memory blocks BLK1-BLKz may include a plurality of strings (e.g., NAND strings) extending along the second direction. As another example, a plurality of NAND strings may be provided along the first or third direction. According to at least one example embodiment, the memory blocks BLK1-BLKz may be selected by a row selector circuit 120 in FIG. 1.

According to at least one example embodiment, at least one (hereinafter, referred to as a ROM and replica block) of memory blocks BLK1-BLKz may be used to store ROM data. The ROM and replica block may include a region for storing ROM data, one or more regions for repairing read fail of the ROM data, and the like. Herein, read and program operations on the regions of the ROM and replica block may be controlled independently from one another. Unlike FIG. 2, the regions of the ROM and replica block may be defined physically within one block. One ROM and replica block may be used to store ROM data and data (hereinafter, referred to as replica ROM data) for repairing read fail of the ROM data. Herein, one memory block may include memory cells which may be simultaneously erased at an erase operation. It may be possible to store ROM data and replica ROM data using one ROM and replica block. Repairing of ROM data at frequent read fail may be made within one ROM block without a need for an additional memory block (e.g., a replica block).

Figure 5:
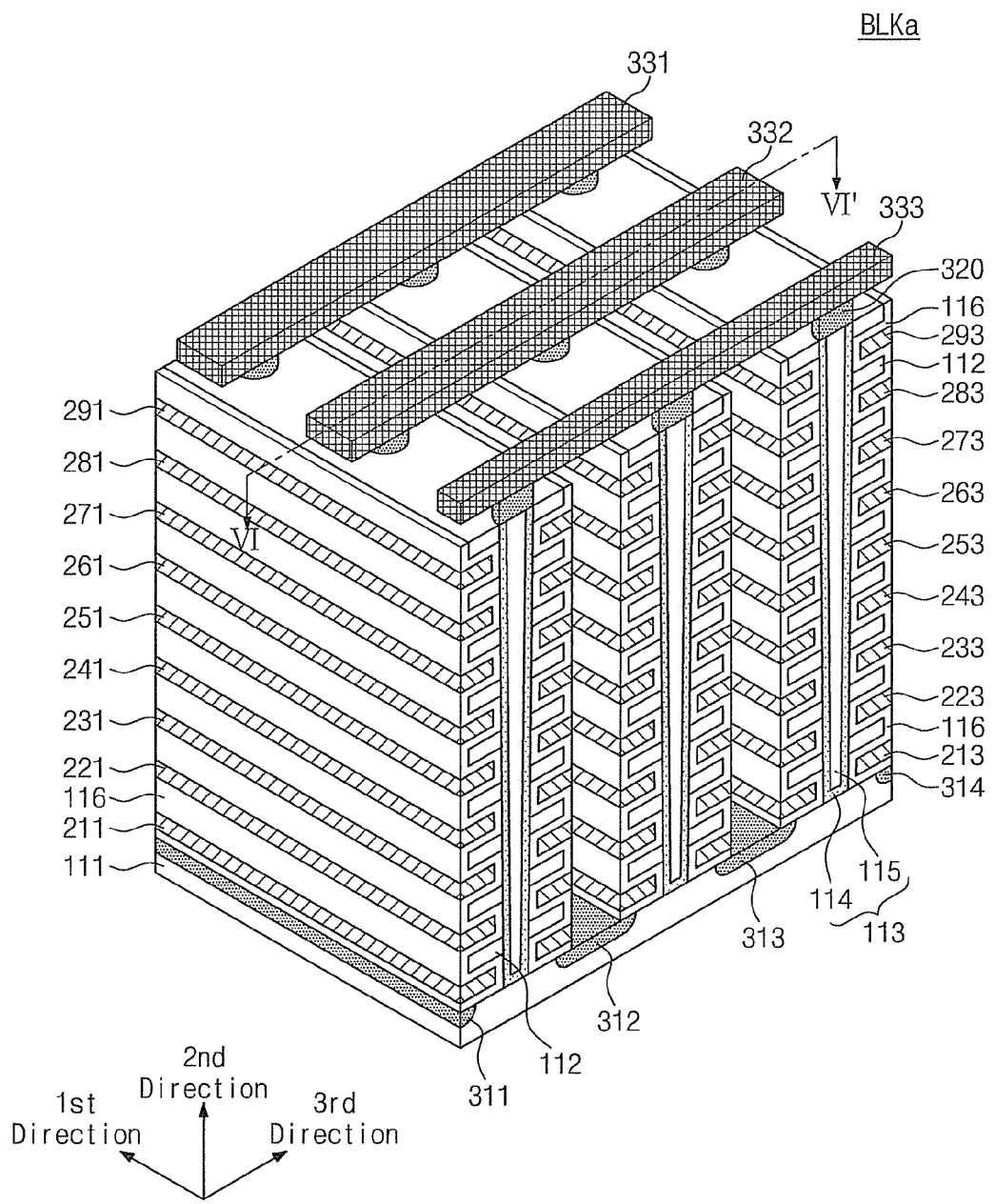
Figure 6:
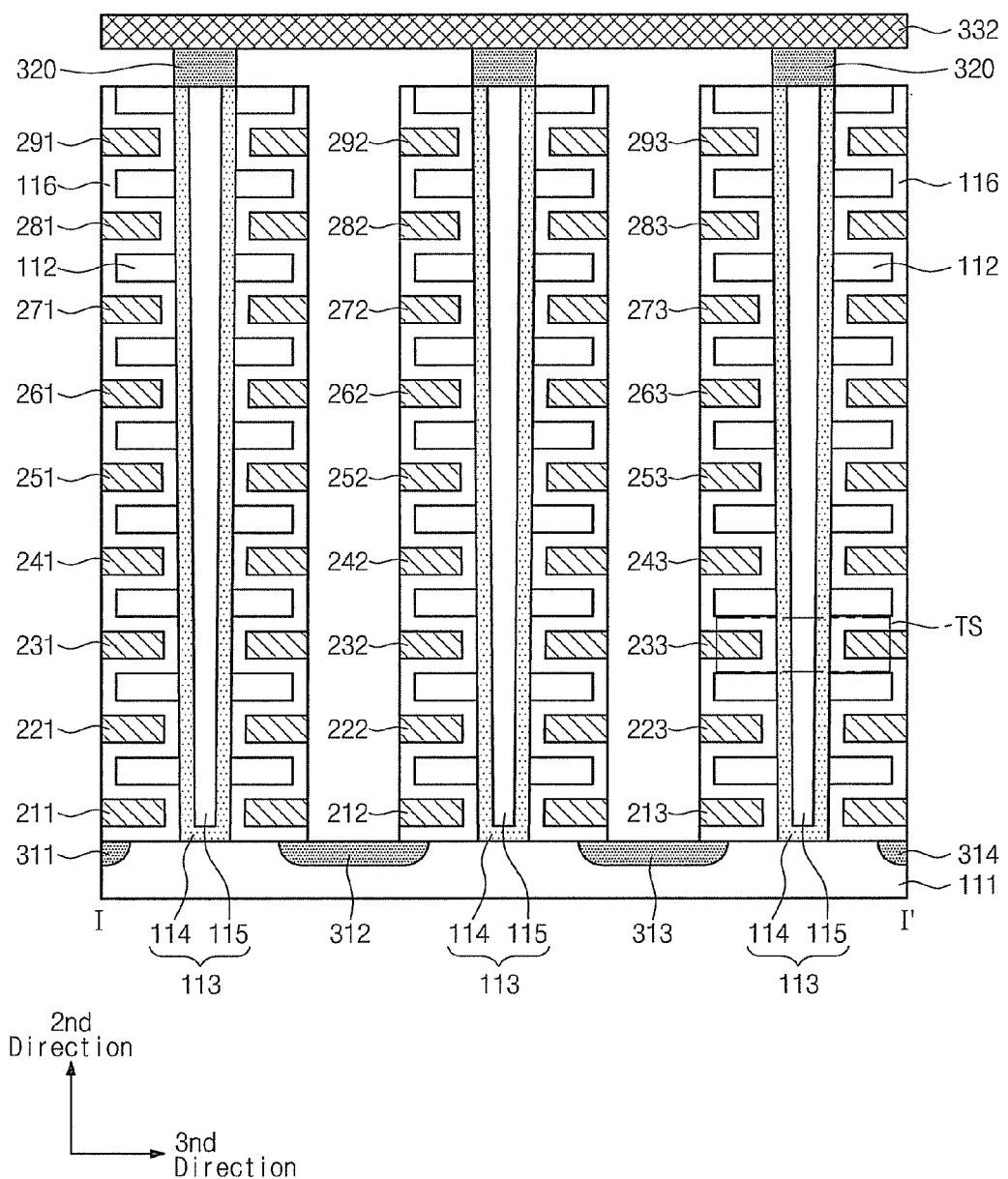

FIG. 5 is a perspective view of a memory block of FIG. 1. FIG. 6 is a cross-sectional view taken along a line VI-VI' of FIG. 5. Referring to FIGS. 5 and 6, a memory block BLKa may include structures extending along the first to third directions. A substrate 111 may be provided. The substrate 111 may be a well of the first conductivity type, for example. The substrate 111 may be a p-well in which the Group III element such as boron may be injected. The substrate 111 may be a pocket p-well which may be provided within an n-well. Below, it may be assumed for purposes of explanation that the substrate 111 may be a p-well (or, a pocket p-well). However, the substrate 111 may not be limited to p-type.

A plurality of doping regions 311-314 extending along the first direction may be provided in the substrate 111. The plurality of doping regions 311-314 may be of a conductive type different from that of the substrate 111. For ease of description, four doping regions 311-314 are illustrated by example in FIG. 5. However, it may be well understood that more or fewer doping regions may be provided along the third direction. The first to third doping regions 311-314 may be an n-type conductive material. Below, it may be assumed for purposes of explanation that the first to third doping regions 311-314 may be n-type. However, the first to third doping regions 311-314 may not be limited to n-type.

On the substrate 111 between the doping regions 311-312, a plurality of insulation materials 112 that may extend along the first direction may be provided sequentially along the second direction. For example, the plurality of insulation materials 112 may be spaced apart along the second direction. The insulation materials 112 may include an insulation material, for example, a silicon oxide. On the substrate 111 between the doping regions 311 and 312, a plurality of pillars 113 may be sequentially disposed along the first direction and may pass through the insulation materials 112 along the second direction. The pillars 113 may be connected to the substrate 111 through the insulation materials 112, respectively.

For example, a surface layer 114 of each pillar 113 may include a semiconductor material of the first conductive type. According to at least one example embodiment, the surface layer 114 of each pillar 113 may include a silicon material which may be doped to be the same conductive type as the substrate 111. Hereinafter, it may be assumed for purposes of explanation that the surface layer 114 of each pillar 113 may include p-type silicon. However, the surface layer 114 of each pillar 113 may not be limited thereto. An inner layer 115 of each pillar 113 may be formed of an insulation material. For example, the inner layer 115 of each pillar 113 may include a silicon oxide. According to at least one example embodiment, the inner layer 115 of each pillar 113 may include an air gap.

Referring to each structure disposed between adjacent doping regions, an insulation layer 116 may be along the exposed surfaces of the substrate 111, the insulation materials 112 and the pillars 113. According to at least one example embodiment, an insulation film 116 that may be provided on a second-direction exposed surface of the last insulation material 112 that may be provided along the second direction may be removed. The insulation film 116 may include one or more material layers. The first conductive materials 211-291 may be on exposed surfaces of the insulation films 116. For example, the first conductive material 211 that may extend along the first direction may be provided between the substrate 111 and an insulation film adjacent to the substrate 111. According to at least one example embodiment, the first conductive materials 211-291 may include a metallic material. According to at least one other example embodiment, the first conductive materials 211-291 may include a conductive material, for example, polysilicon.

A same or similar structure may be disposed between the doping regions 311 and 312, and may be between the doping regions 312 and 313. A same or similar structure may be between the doping regions 312 and 313, and may be between the doping regions 313 and 314. Drains 320 may be provided on the pillars 113, respectively. For example, the drains 320 may include a silicon material doped to be a second conductive type. For example, the drains 320 may include a silicon material that may be doped to be n-type. Hereinafter, it may be assumed for purposes of explanation that the drains 320 may include n-type silicon. However, the drains 320 may not be limited thereto. The width of each of the drains 320 may be wider than that of a corresponding pillar 113. For example, each drain 320 may be provided in a pad shape on the upper surface of a corresponding pillar 113.

Conductive materials 331-333 that may extend in the third direction may be provided to be connected with the drains 320. The conductive materials 331-333 may be sequentially disposed along the first direction. As one example, the conductive materials 331-333 may include a metal material. As another example, the conductive materials 331-333 may include polysilicon. In FIG. 5, a structure that may be between adjacent doping regions (e.g., 311 and 312) may include pillars 113 which may be electrically connected with conductive materials (e.g., 331, 332 and 333) that may be acting as a bit line, respectively. The pillars 113 that may be electrically connected with conductive materials (e.g., 331, 332 and 333) that may be acting as a bit line may constitute a plane. This means that one memory block may be formed of a plurality of planes.

Figure 7:
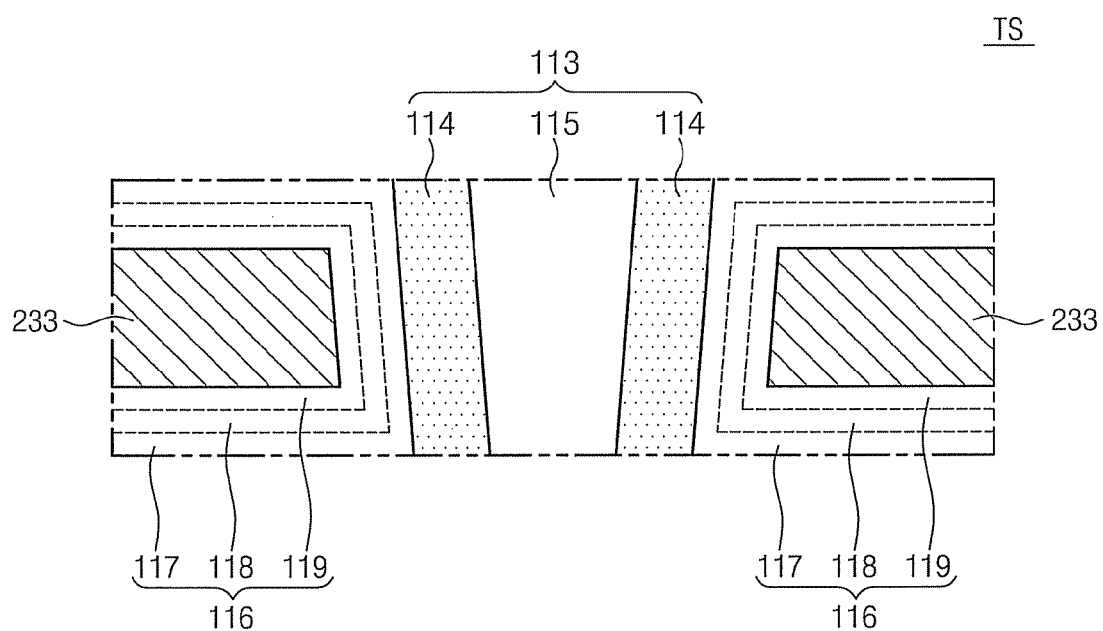

FIG. 7 is a cross sectional diagram of a transistor structure TS in FIG. 6. Referring to FIGS. 5-7, an insulation layer 116 may include the first to third sub-insulation layers 117, 118 and 119. A surface layer 114, that may include p-type silicon, of the pillar 113 may act as a body. The first sub-insulation layer 117 that may be adjacent to the pillar 113 may act as a tunnel insulation film. For example, the first sub-insulation layer 117 that may be adjacent to the pillar 113 may include a thermal oxide layer. The second sub-insulation layer 118 may serve as a charge storage layer. For example, the second sub-insulation layer 118 may serve as a charge trap layer. For example, the second sub-insulation layer 118 may include a nitride layer and/or a metal oxide layer (e.g., an aluminum oxide layer and/or a hafnium oxide layer).

The third sub-insulation layer 119 that may be adjacent to the conductive material 233 may serve as a blocking insulation layer. According to at least one example embodiment, the third sub-insulation layer 119 that may be adjacent to the conductive material 233 that may extend along the first direction may be formed as a single layer or a multi-layer. The third sub-insulation layer 119 may be a high dielectric layer (e.g., an aluminum oxide layer and/or a hafnium oxide layer) that may have a higher dielectric constant than the first and second sub-insulation layers 117 and 118.

The conductive material 233 may serve as a gate (e.g., a control gate). The conductive material 233 that may act as a gate (e.g., a control gate), the third sub-insulation film 119 that may act as a blocking insulation layer, the second sub-insulation film 118 that may act as a charge storage layer, the first sub-insulation film 117 that may act as a tunneling insulation layer, and the surface layer 114, including p-type silicon, that may act as a body may constitute a transistor (e.g., a memory cell transistor structure). According to at least one example embodiment, the first to third sub-insulation layers 117-119 may be an oxide-nitride-oxide (ONO) structure. Below, the surface layer 114, that may include the p-type silicon, of the pillar 113 may be referred to as the second-direction body.

A memory block BLKa may include a plurality of pillars 113. The memory block BLKa may include a plurality of NAND strings. The memory block BLKa may include a plurality of NAND strings that may extend along the second direction (e.g., a direction vertical to the substrate). Each NAND string NS may include a plurality of transistor structures TS that may be along the second direction. At least one of the transistor structures TS in each NAND string may serve as a string selection transistor SST. At least one of the remaining transistor structures TS in each NAND string may serve as a ground selection transistor GST.

Gates (e.g., control gates) may correspond to conductive materials 211-291, 212-292 and 213-293 that may extend along the first direction. The gates (e.g., the control gates) may extend in the first direction so that they be word lines and at least two selection lines (e.g., at least one string selection line SSL and at least one ground selection line GSL). The conductive materials 331-333 that may extend along the third direction may be connected to one ends of the NAND strings, respectively. According to at least one example embodiment, the conductive materials 331-333 that may extend along the third direction may serve as bit lines BL. In one memory block BLKa, a plurality of NAND strings may be connected to one bit line BL. Doping regions 311-314 that may extend in the first direction may be provided to other ends of the NAND strings, respectively. The doping regions 311-314 that may extend along the first direction may serve as a common source line CSL.

The memory block BLKa may include a plurality of NAND strings that may extend along a direction (e.g., the second direction) vertical to the substrate 111, and may serve as a NAND flash memory block (e.g., a charge trapping type) where the plurality of NAND strings may be connected to one bit line BL.

Figure 8:
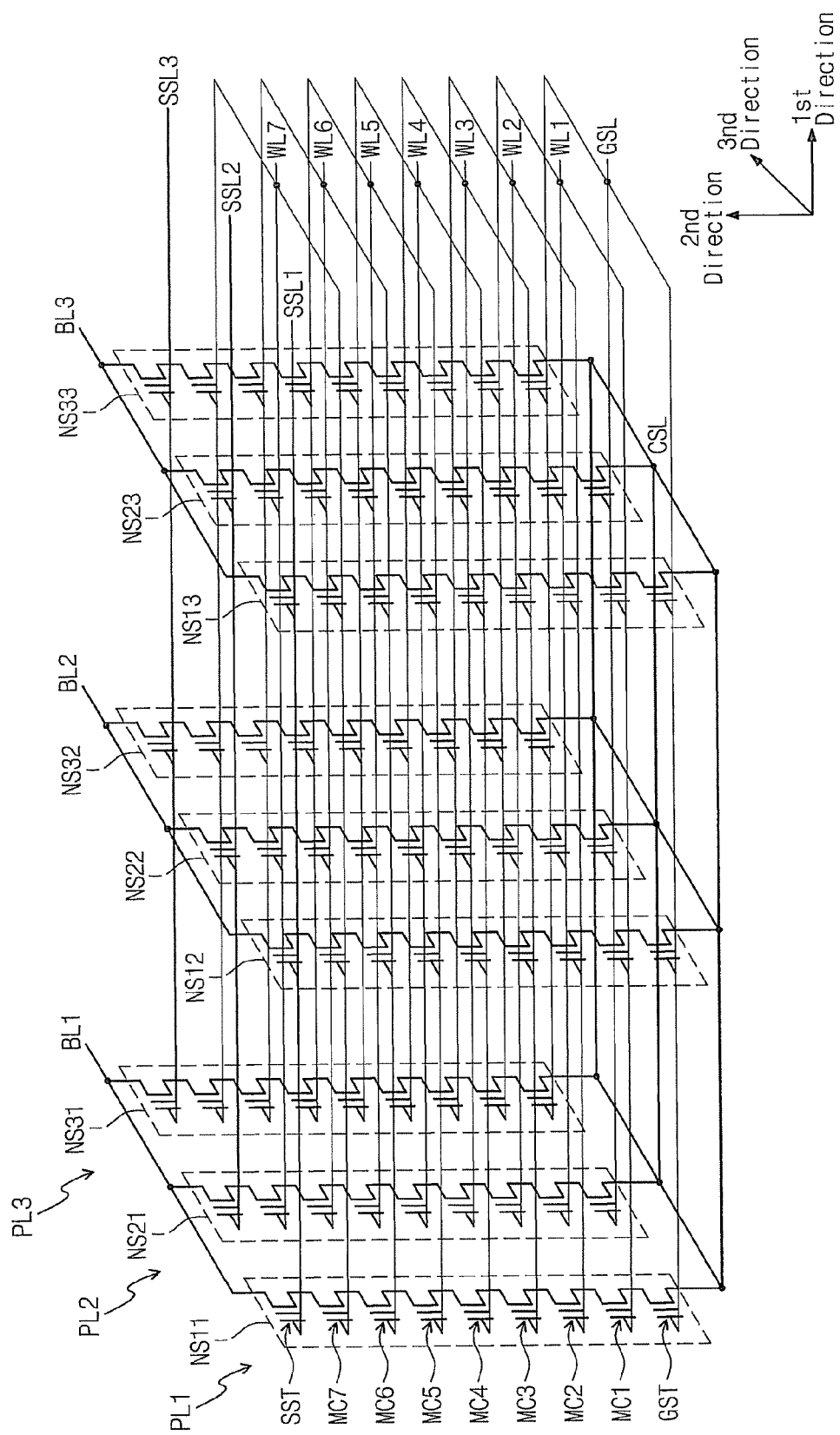

FIG. 8 is a circuit diagram illustrating an equivalent circuit of a memory block of FIG. 5 according to at least one example embodiment of the inventive concepts. Referring to FIG. 8, NAND strings may be provided between a bit line BL1 and a common source line CSL. For example, NAND strings NS11, NS21, and NS31 may be provided between the bit line BL1 and the common source line CSL, NAND strings NS12, NS22, and NS32 may be provided between a bit line BL2 and the common source line CSL, and NAND strings NS13, NS23, and NS33 may be provided between a bit line BL3 and the common source line CSL. The bit lines BL1-BL3 may correspond to conductive materials 331-333 (refer to FIG. 5) that may extend along the third direction. A string selection transistor SST of each NAND string may be connected with a corresponding bit line. A ground selection transistor GST of each NAND string may be connected with the common source line CSL. Memory cells MC may be provided between the string and ground selection transistors SST and GST in each NAND string.

NAND strings that may be connected in common with one bit line may be one column. For example, NAND strings NS11-NS31 that may be connected with the bit line BL1 may form the first column. NAND strings NS12-NS32 that may be connected with the bit line BL2 may form the second column. NAND strings NS13-NS33 that may be connected with the bit line BL3 may form the third column. NAND strings that may be connected with one string selection line SSL may form a row. For example, NAND strings NS11-NS13 that may be connected with a string selection line SSL1 may be a first row. NAND strings NS21-NS23 that may be connected with a string selection line SSL2 may be a second row. NAND strings NS31-NS33 that may be connected with a string selection line SSL3 may be a third row.

As illustrated in FIG. 8, NAND strings that may be arranged in rows and columns may be configured to share a ground selection line GSL. Memory cells in each row (or, each plane) may share word lines WL1-WL7 that may be arranged at other layers. For example, memory cells MC1 that may be in a plane PL1 and that may be adjacent to the ground selection transistors GST may share the word line WL1, and memory cells MC7 that may be in the plane PL1 and that may be adjacent to the string selection transistors SST may share the word line WL7.

NAND strings that may be in the same row/plane may share a string selection line. For example, NAND strings NS 11, NS 12 and NS 13 that may be in the plane PL1 may share a string selection line SSL1, NAND strings NS21, NS22, and NS23 that may be in the plane PL2 may share a string selection line SSL2, and NAND strings NS31, NS32, and NS33 that may be in the plane PL3 may share a string selection line SSL3. The string selection lines SSL1, SSL2 and SSL3 may be controlled independently, so that NAND strings (e.g., NS11, NS12 and NS13) that may be in any plane/row (e.g., PL1) may be electrically connected with bit lines BL1, BL2 and BL3, respectively. NAND strings (e.g., NS21, NS22, NS23, NS31, NS32 and NS33) that may be in the remaining planes/rows (e.g., PL2 and PL3) may be electrically separated from the bit lines BL1, BL2, and BL3 by the string selection lines.

According to at least one example embodiment, at program and read operations, one of the string selection lines SSL1-SSL3 may be selected by a row decoder circuit 120 (refer to FIG. 1). The program and read operations may be executed by the row/plane unit of NAND strings NS11~NS13, NS21~NS23, and NS31~NS33. A plane defined by the first and second directions, a group of NAND strings that may be in each row, may constitute a row or a plane as described above. One of planes of a memory block may be used as a region for storing ROM data, and at least one of the remaining planes may be used as a region for repairing read fail of the ROM data. For example, NAND strings NS11, NS12 and NS13 that may be in the plane PL1 may constitute a region for storing ROM data, and NAND strings NS21, NS22, and NS23 that may be in the plane PL2 may constitute a region for storing replica ROM data used to repair read fail of the ROM data.

In FIG. 8, three planes PL1, PL2, and PL3 are illustrated as an example. However, example embodiments may not be limited thereto. The number of planes that may be used as a region for storing ROM data may be determined according to the amount of ROM data, and the number of planes that may be used as a region for repairing read fail of the ROM data may be determined according to the number of planes that may be used as a region for storing the ROM data.

One memory block may be used to store ROM data and replica ROM data. This memory block may be referred to as a ROM and replica block. It may be possible to reduce the number of memory blocks associated with ROM data by storing ROM data and replica ROM data using only one memory block. This means that a user data capacity of a nonvolatile memory device may increase.

Figure 9:
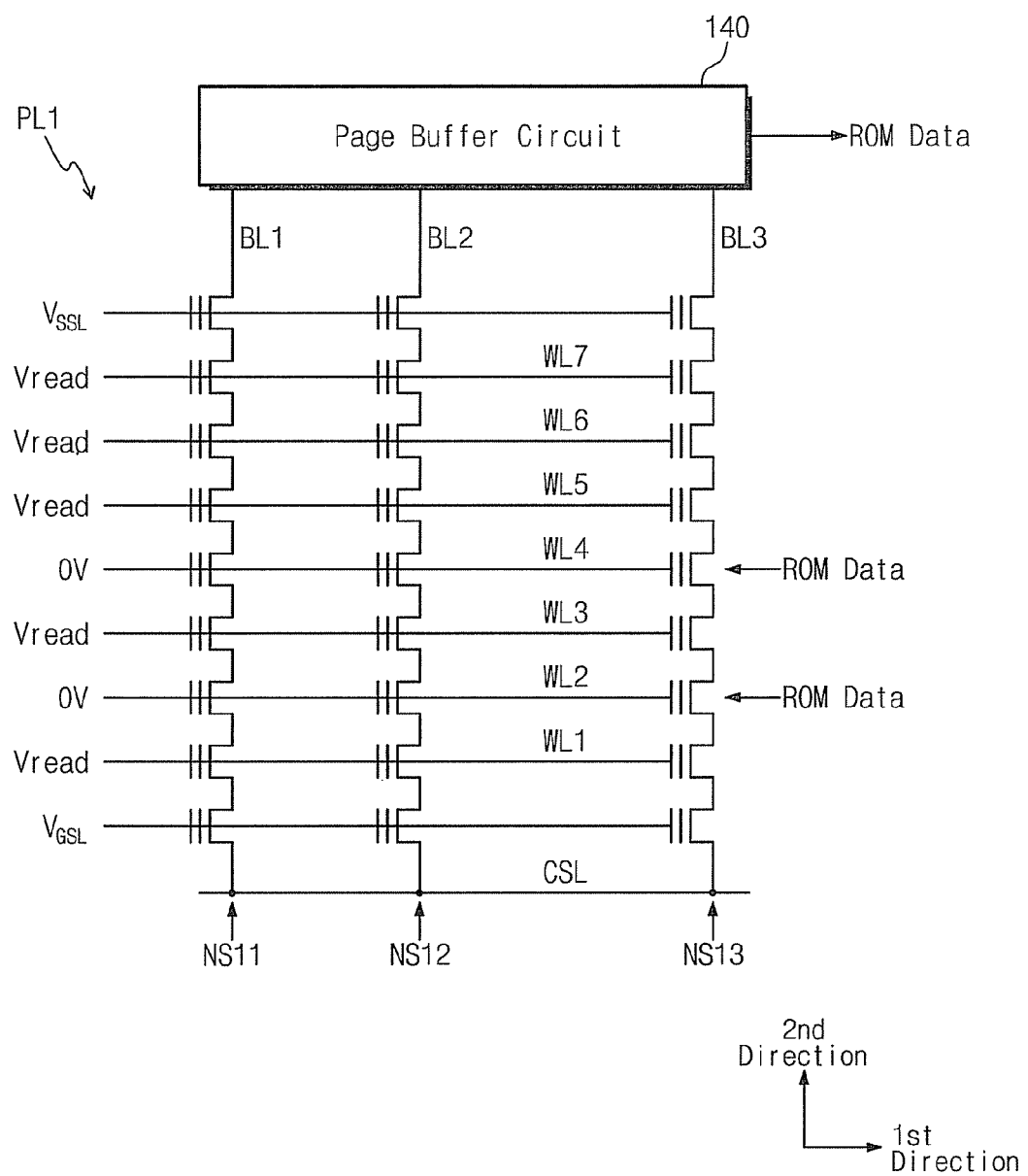

FIG. 9 is a circuit diagram illustrating a bias condition for reading ROM data stored in a memory block of FIG. 8. It may be assumed for purposes of explanation that ROM data may be stored in a plane (e.g., PL1) of a ROM and replica block and replica ROM data may be stored in a plane (e.g., PL2) thereof. Two word lines (e.g., WL2 and WL4) of word lines WL1-WL7 may be used to store ROM data. Memory cells that may be connected with the word lines WL2 and WL4 may be programmed depending upon ROM data. Memory cells that may be connected with the remaining word lines may maintain an erase state. Memory cells in each column and that may be connected with the word lines WL2 and WL4 may be programmed to have the same data bit (e.g., data '1' or data '0'). This may be to prepare for data fail due to charge loss.

ROM data that may be stored in the plane PL1 of the ROM and replica block may be read by a page buffer circuit 140 that may be under the control of control logic 160 at power-up, for example. As illustrated in FIG. 9, ROM data may be read by applying a voltage of 0V to the word lines WL2 and WL4 and a read voltage Vread to the remaining word lines WL1, WL3, and WL5-WL7. Although one of memory cells in any column (e.g., BL1) and that may be connected with the word lines WL2 and WL4 may cause data fail due to charge loss, ROM data that may be stored in the remaining memory cell may be read out normally. The read ROM data may be stored in a register 161 of the control logic 160 via an input/output interface 150.

According to at least one example embodiment, at a read operation associated with the ROM and replica block, word lines WL1, WL3 and WL5 that may be adjacent to the word lines WL2 and WL4 that may be associated with the ROM data may be driven by a voltage that may be higher than the read voltage Vread. According to at least one example embodiment, at the read operation associated with the ROM and replica block, the remaining word lines WL1, WL3, and WL5-WL7 other than the word lines WL2 and WL4 that may be associated with the ROM data may be driven by a voltage higher than the read voltage Vread.

Figure 10:
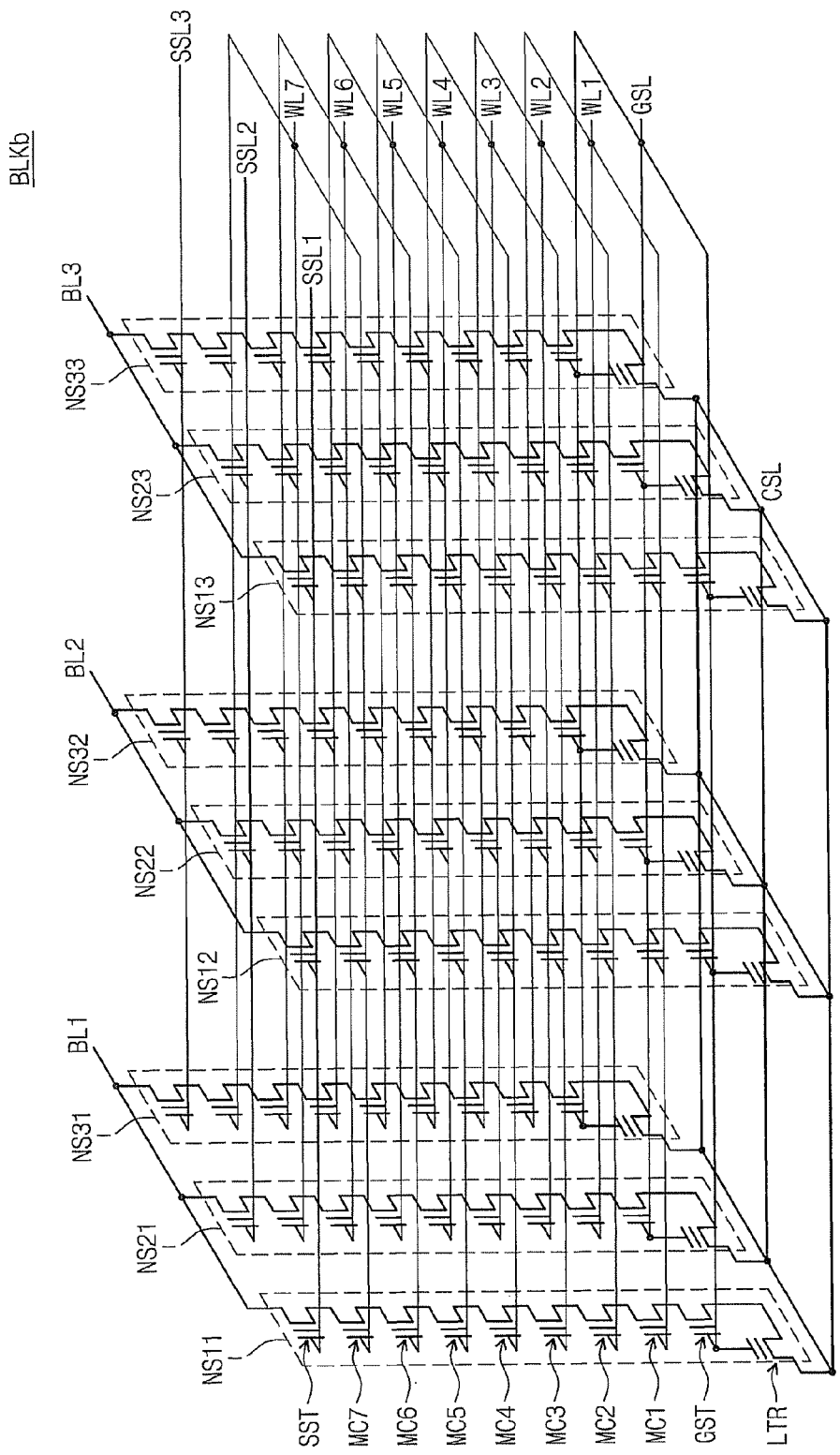

FIGS. 10-13 are circuit diagrams illustrating equivalent circuits of a memory block of FIG. 5 according to some example embodiments of the inventive concepts. Referring to FIG. 10, a lateral transistor LTR may be at each NAND string of a memory block BLKb. In each NAND string, the lateral transistor LTR may be connected between a ground selection transistor GST and a common source line CSL. A gate (e.g., a control gate) of the lateral transistor LTR may be connected to a ground selection line GSL with a gate (e.g., a control gate) of the ground selection transistor GST. The memory block BLKb in FIG. 10 may be otherwise substantially identical to that in FIG. 8, and description thereof may be omitted.

Figure 11:
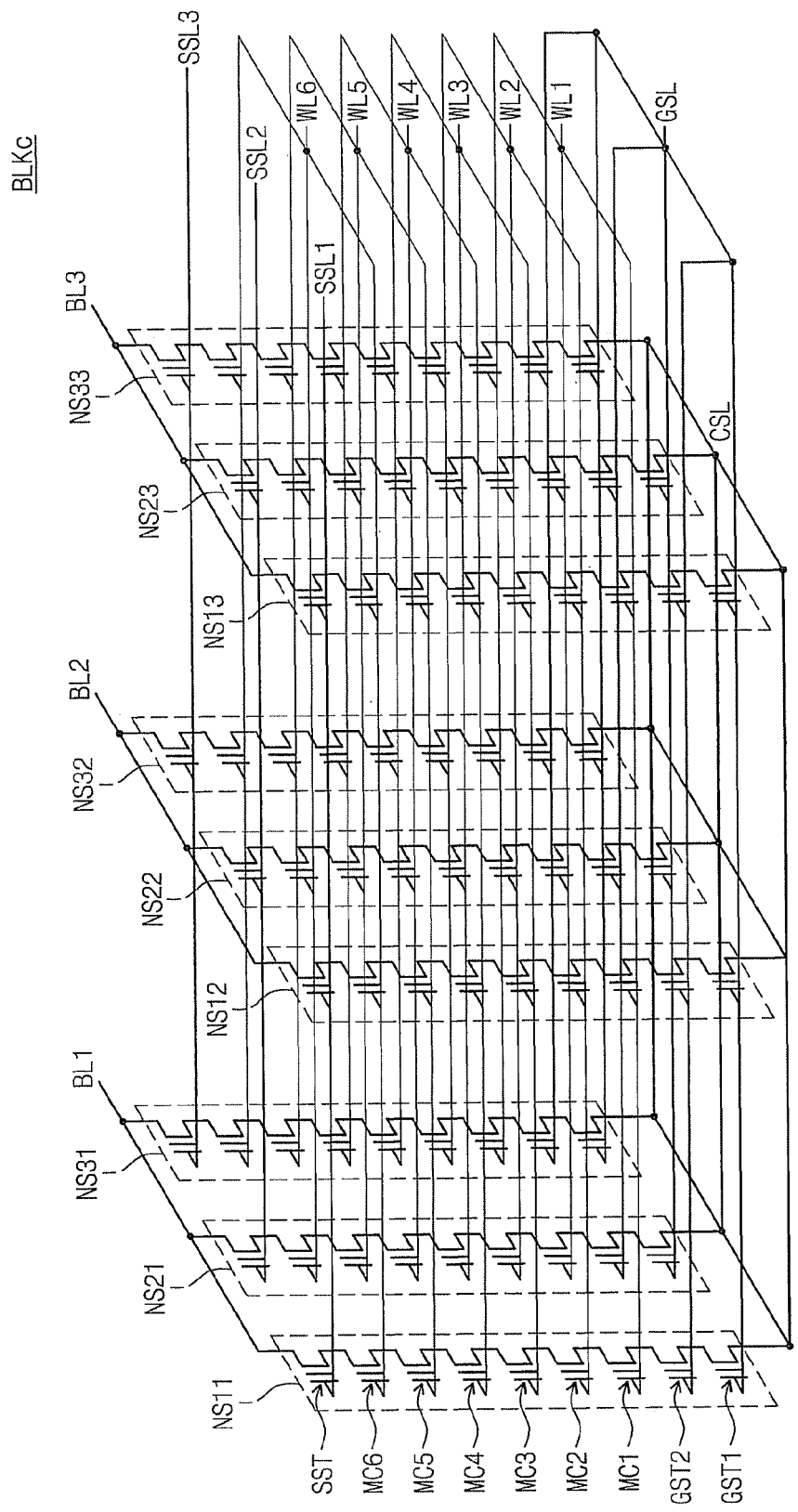

As illustrating in FIG. 11, each NAND string may include two ground selection transistors GST1 and GST2 that may be connected between memory cells MC1-MC6 and the common source line CSL. The ground selection transistors GST1 and GST2 may be connected with one ground selection line GSL. The memory block BLKc in FIG. 11 may be substantially identical to that in FIG. 8 except for the above-described difference.

Figure 12:
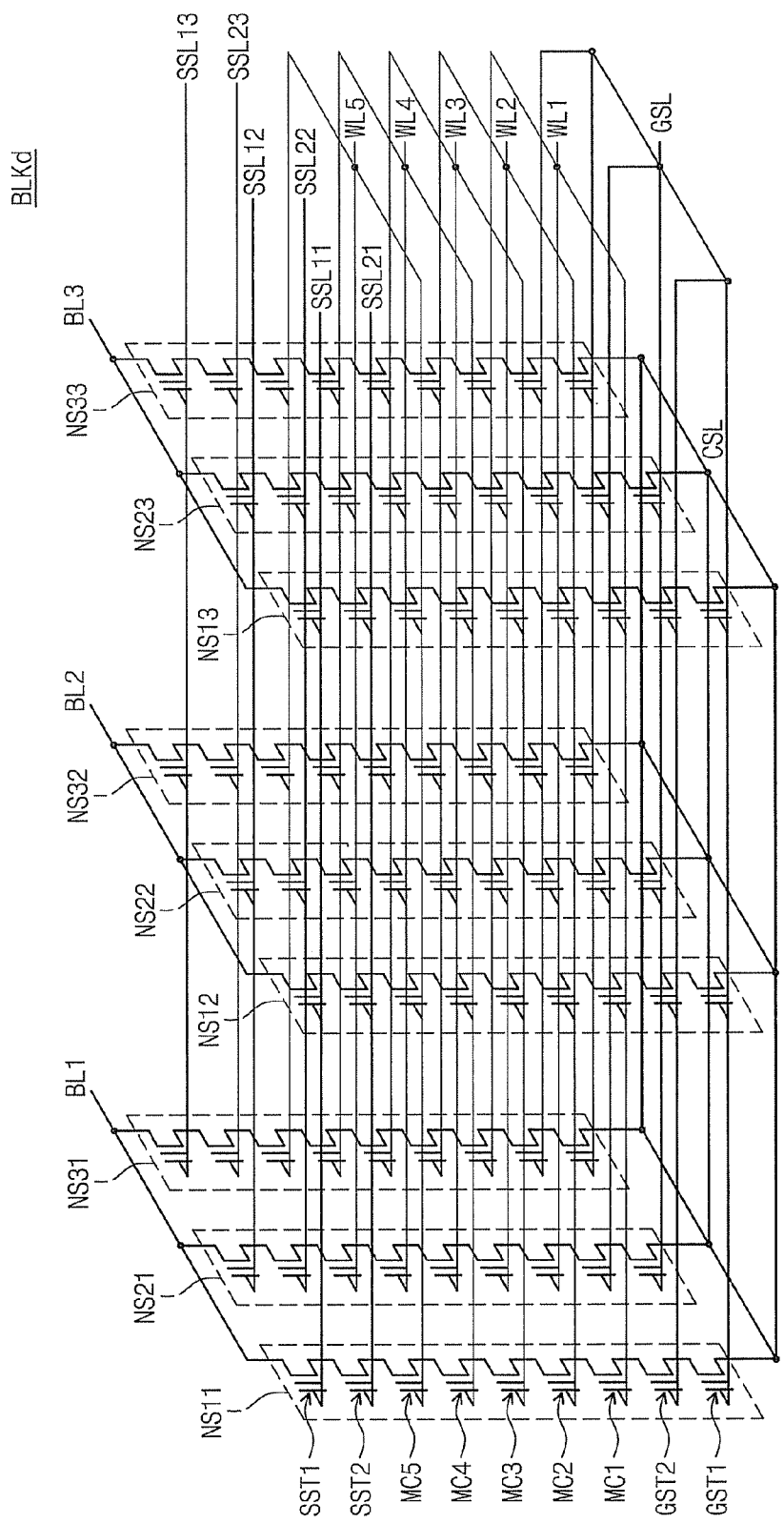
Figure 13:
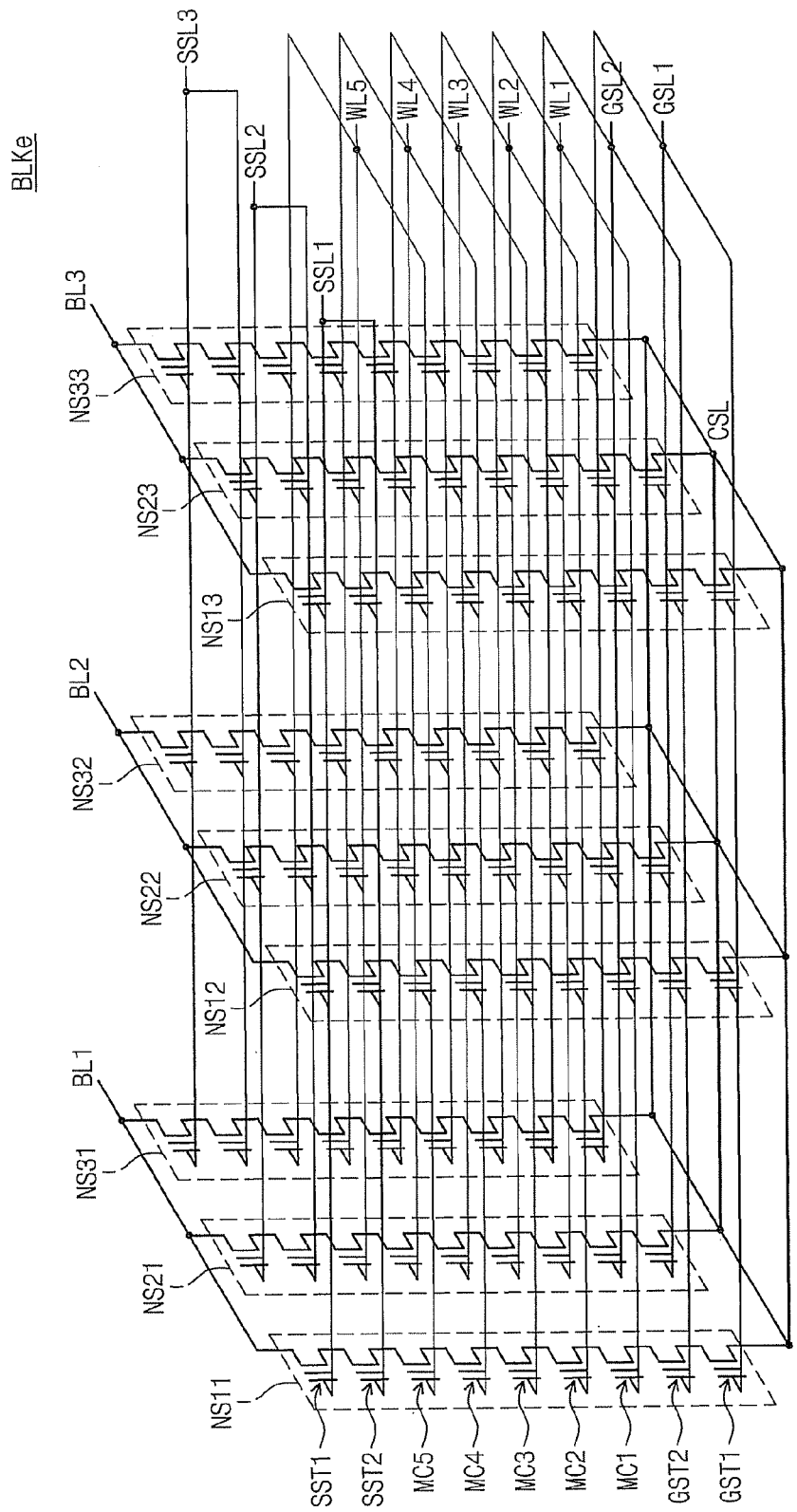

As compared with the memory block BLKc in FIG. 11, a memory block BLKd in FIG. 12 may include two string selection transistors SST1 and SST2 that may be between the memory cells MC1-MC5 and a bit line BL. The string selection transistors SST1 and SST2 that may be in each NAND string may be controlled independently by corresponding string selection lines SSL1 and SSL2. The memory block BLKd in FIG. 12 may be substantially identical to that in FIG. 11 except for the above-described difference, and description thereof may be omitted. Unlike the memory block BLKd illustrated in FIG. 12, a memory block BLKe in FIG. 13 may be configured such that string selection transistors SST1 and SST2 that may be in each NAND string may be controlled by string selection lines which may be connected electrically. The memory block BLKe in FIG. 13 may be substantially identical to that in FIG. 12 except for the above-described difference, and description thereof may be omitted.

It may be comprehended that the example embodiment may not be limited to various circuit components described in FIGS. 10-13. One memory block may be used to store ROM data and replica ROM data. The number of memory blocks that may be associated with ROM data may be reduced by storing ROM data and replica ROM data using one memory block.

Figure 14:
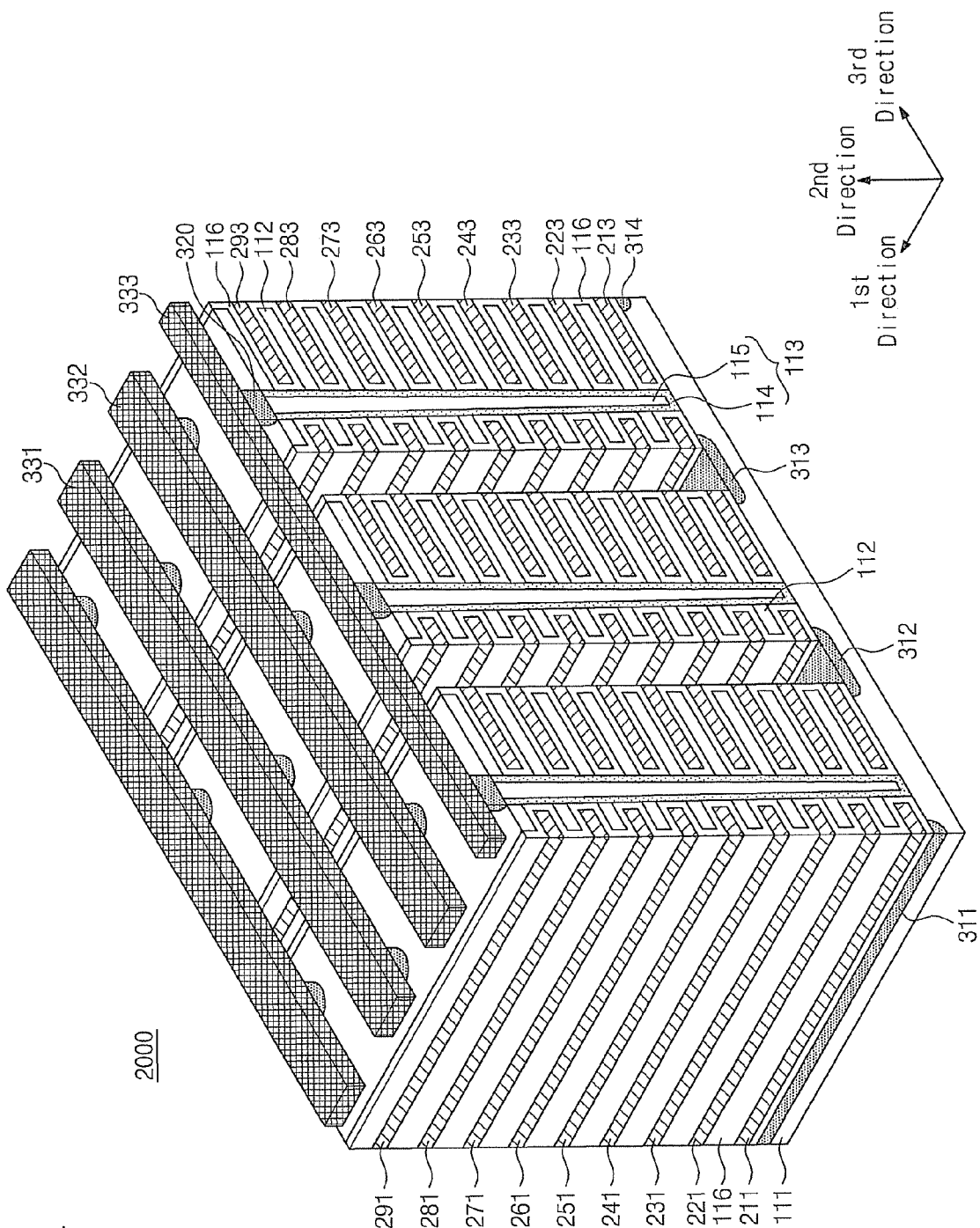

FIG. 14 is a perspective view illustrating a part of a memory block of FIG. 4 according to still other example embodiments of the inventive concepts. In FIG. 14, constituent elements which may have the same function as those in FIG. 5 may be represented by the same reference numerals, and description thereof may be omitted. A memory block 2000 in FIG. 14 may be substantially identical to that in FIG. 5 except that strings (or, pillars) in a structure (or, plane) that may be placed between adjacent doping regions (e.g., 311 and 312) may be arranged in two lines. For example, strings may be arranged in a zigzag pattern.

Figure 15:
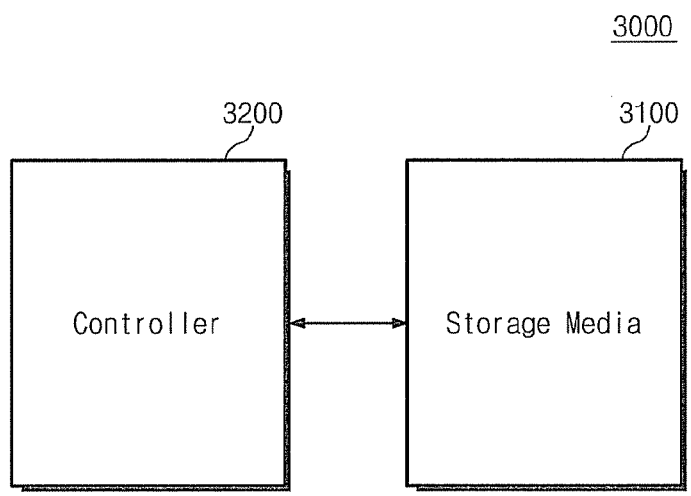

FIG. 15 is a block diagram illustrating data storage devices including a nonvolatile memory device according to at least one example embodiment of the inventive concepts. Referring to FIG. 15, a data storage device 3000 may include a storage medium 3100 and a controller 3200. The storage medium 3100 may be used to store data information of various data formats such as text, graphics, software code, and/or the like. The storage medium 3100 may be a nonvolatile memory device 1000 which may include a memory block storing ROM data and replica ROM data. One memory block may be used to store ROM data and replica ROM data. The number of memory blocks that may be associated with ROM data may be reduced by storing ROM data and replica ROM data using one memory block. The controller 3200 may be configured to control the storage medium in response to an external request.

Figure 16:
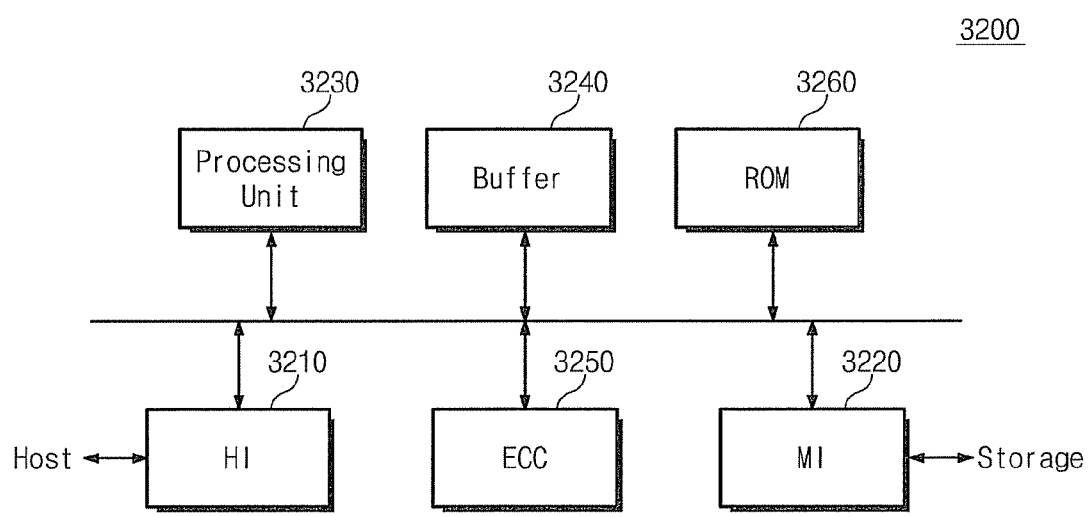

FIG. 16 is a block diagram illustrating controllers according to at least one example embodiment of the inventive concepts. Referring to FIG. 16, a controller 3200 according to an example embodiment may include the first interface HI (e.g., a host interface) 3210, a second interface MI (e.g., memory interface) 3220, a processing unit 3230, a buffer 3240, an ECC unit 3250 and/or a ROM 3260. The first interface 3210 may interface with an external device Host (e.g., a host). The second interface 3220 may be configured to interface with a storage media 3100 illustrated in FIG. 15. For example, the processing unit 3230 may be configured to control an overall operation of the controller 3200. For example, the processing unit 3230 may be configured to operate firmware (e.g., a Flash Translation Layer (FTL)) that may be stored in the ROM 3260. The buffer 3240 may be used to temporarily store data that may be transferred from the external device via the first interface 3210. The buffer 3240 may be used to temporarily store data that may be transferred from the storage media 3100 via the second interface 3220. The ECC unit 3250 may be configured to encode data that may be stored in the storage media 3100 and/or to decode data that may be read out from the storage media 3100.

Figure 17:
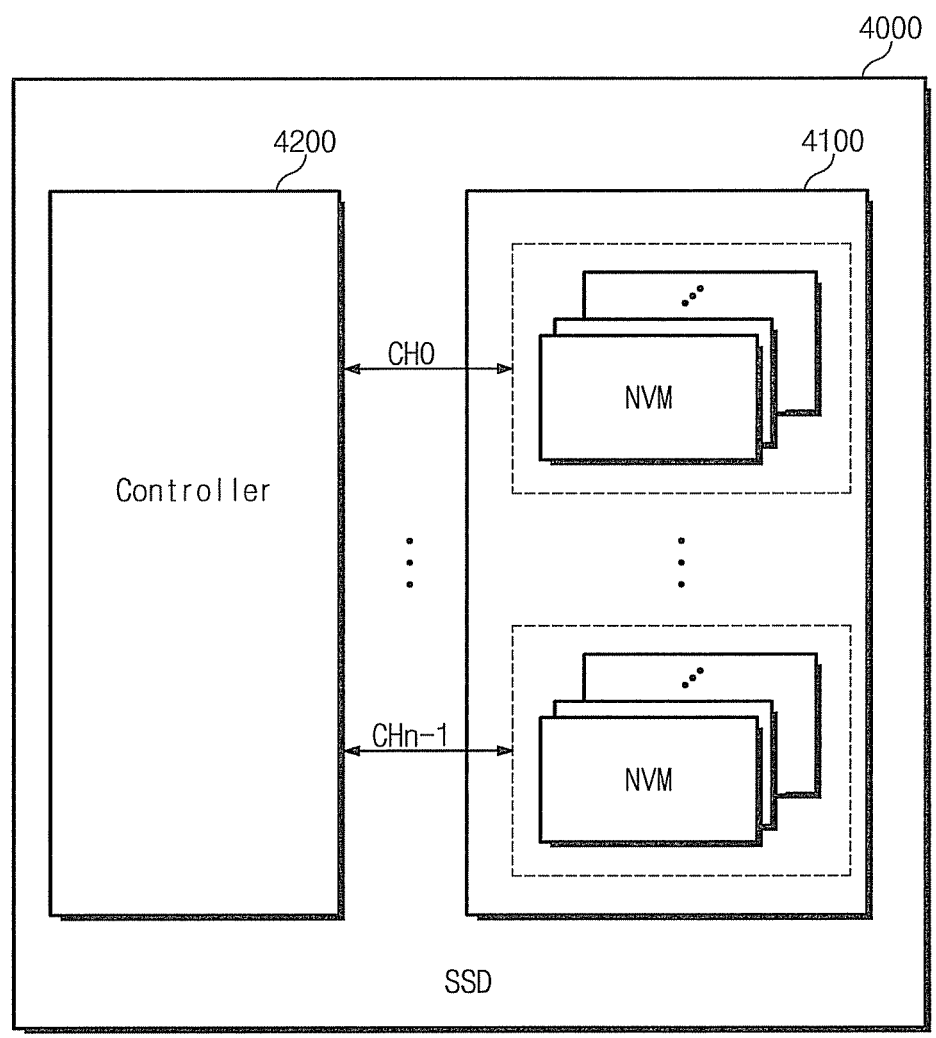

FIG. 17 is a block diagram illustrating solid state drives using a nonvolatile memory device according to example embodiments of the inventive concepts. Referring to FIG. 17, a solid state drive (SSD) 4000 may include a storage medium 4100 and a controller 4200. The storage medium 4100 may be connected with the controller 4200 via a plurality of channels, each of which may be connected in common with a plurality of nonvolatile memories. Each nonvolatile memory may be formed of a nonvolatile memory device 1000 which may include a memory block storing ROM data and replica ROM data. One memory block may be used to store ROM data and replica ROM data. It may be possible to reduce the number of memory blocks that may be related to ROM data by storing ROM data and replica ROM data using only one memory block. The controller 4200 may be configured to control the storage medium 4100.

Figure 18:
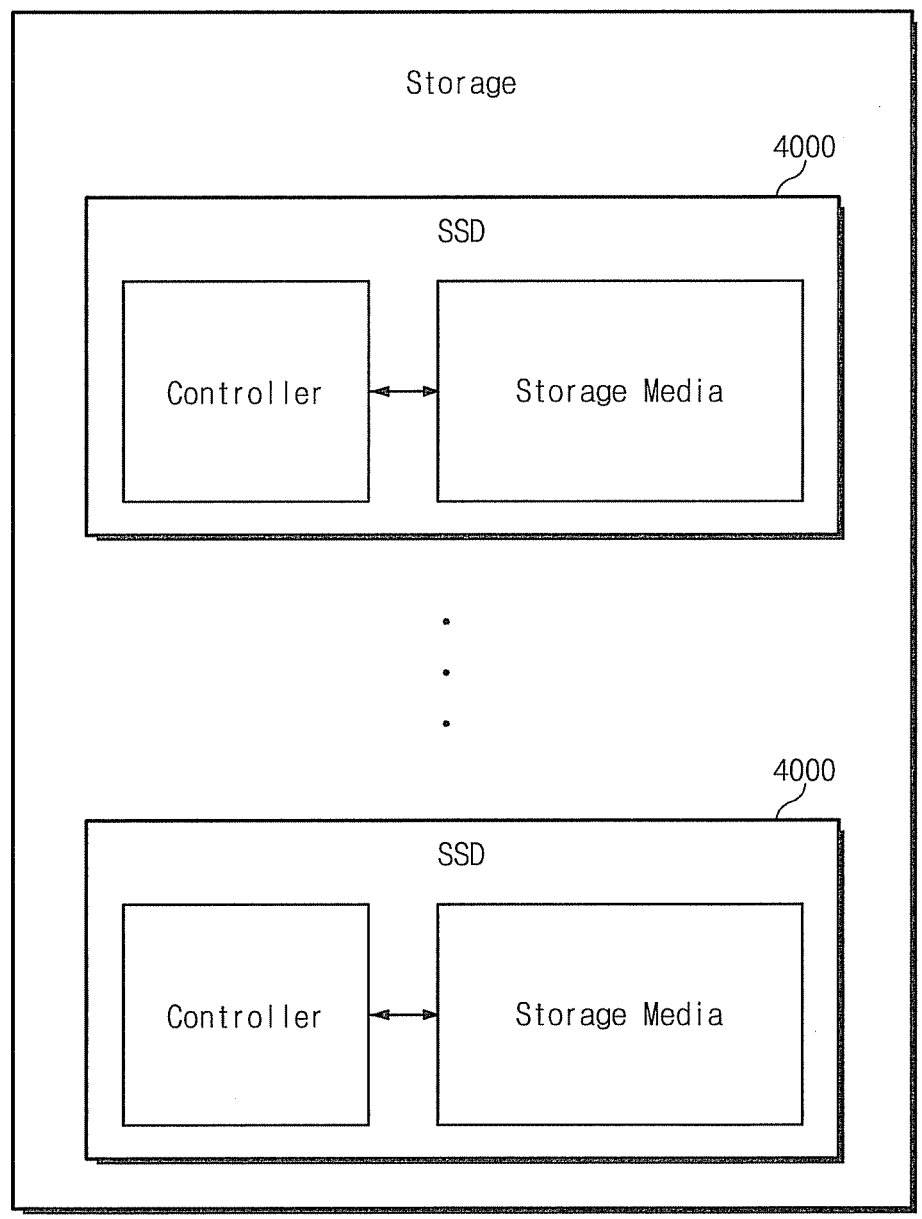
Figure 19:
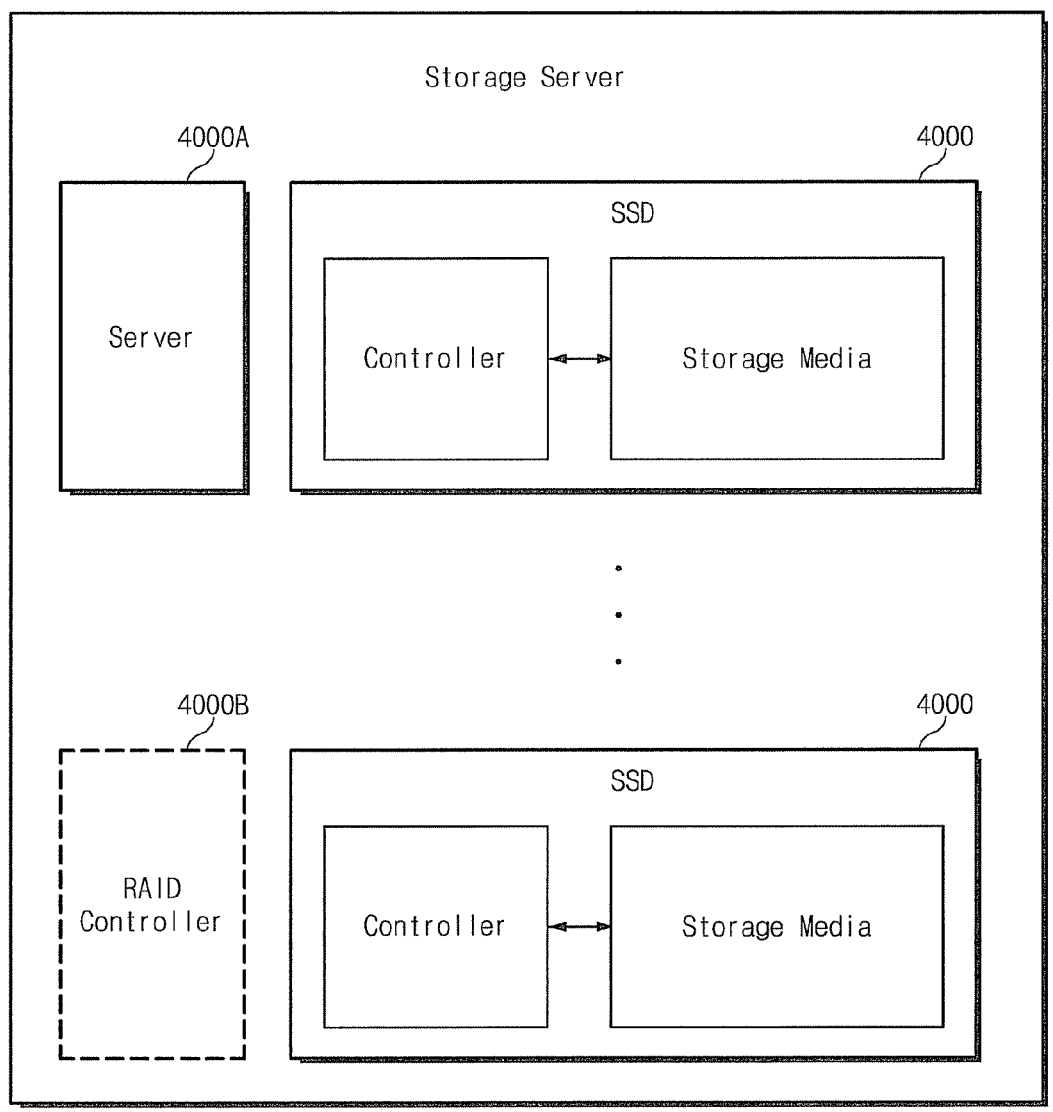

FIG. 18 is a block diagram illustrating a storage using a solid state drive of FIG. 17. FIG. 19 is a block diagram illustrating storage servers using a solid state drive of FIG. 17. An SSD 4000 according to at least one example embodiment may be included on the storage. As illustrated in FIG. 18, the storage may include a plurality of solid state drives 4000 which may be configured the same as described in FIG. 17. An SSD 4000 according to at least one example embodiment may be used to configure a storage sever. As illustrated in FIG. 19, a storage server may include a plurality of solid state drives 4000, which may be configured the same as described in FIG. 17, and a server 4000A. It may well be comprehended that a well-known RAID controller 4000B may be provided within the storage server.

Figure 20:
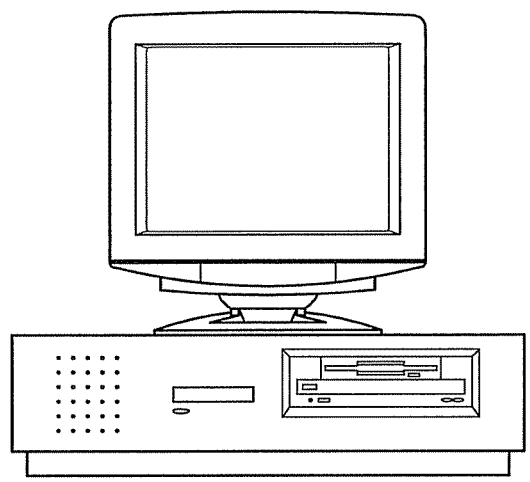
Figure 20:
Figure 20:
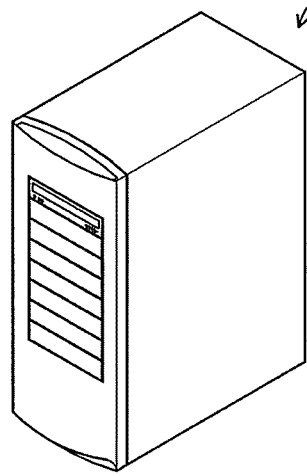
Figure 21:
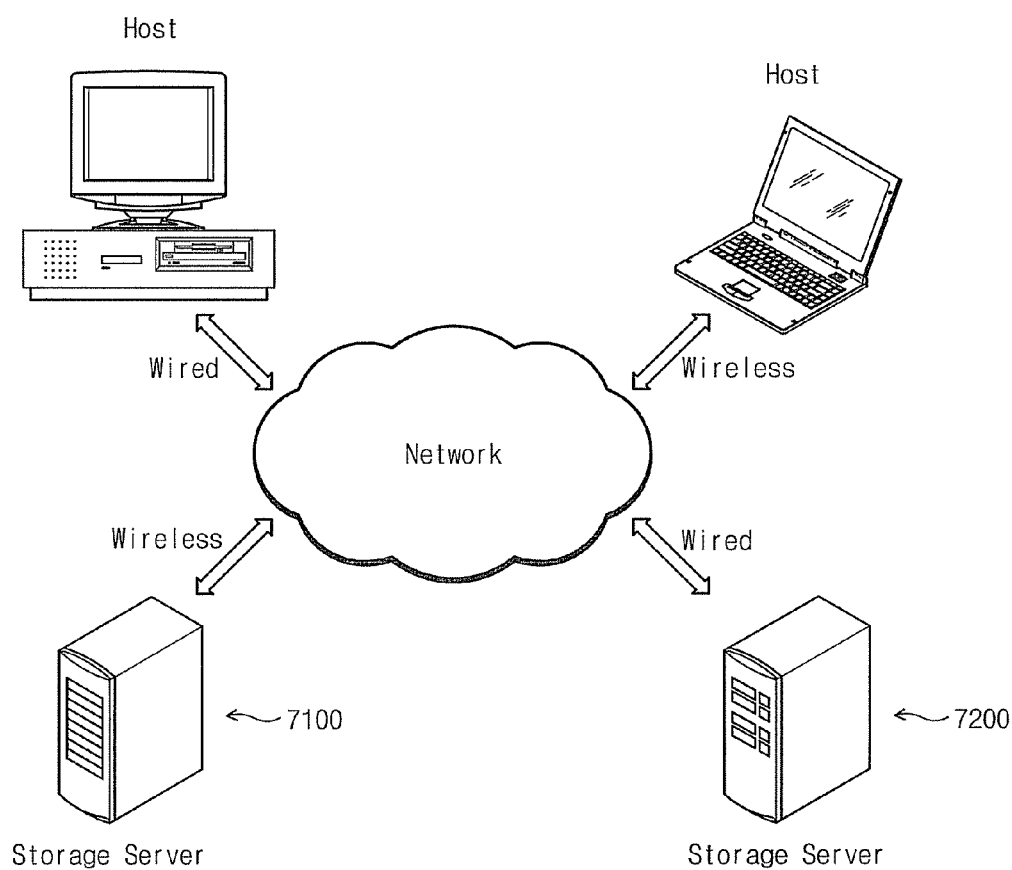
Figure 22:
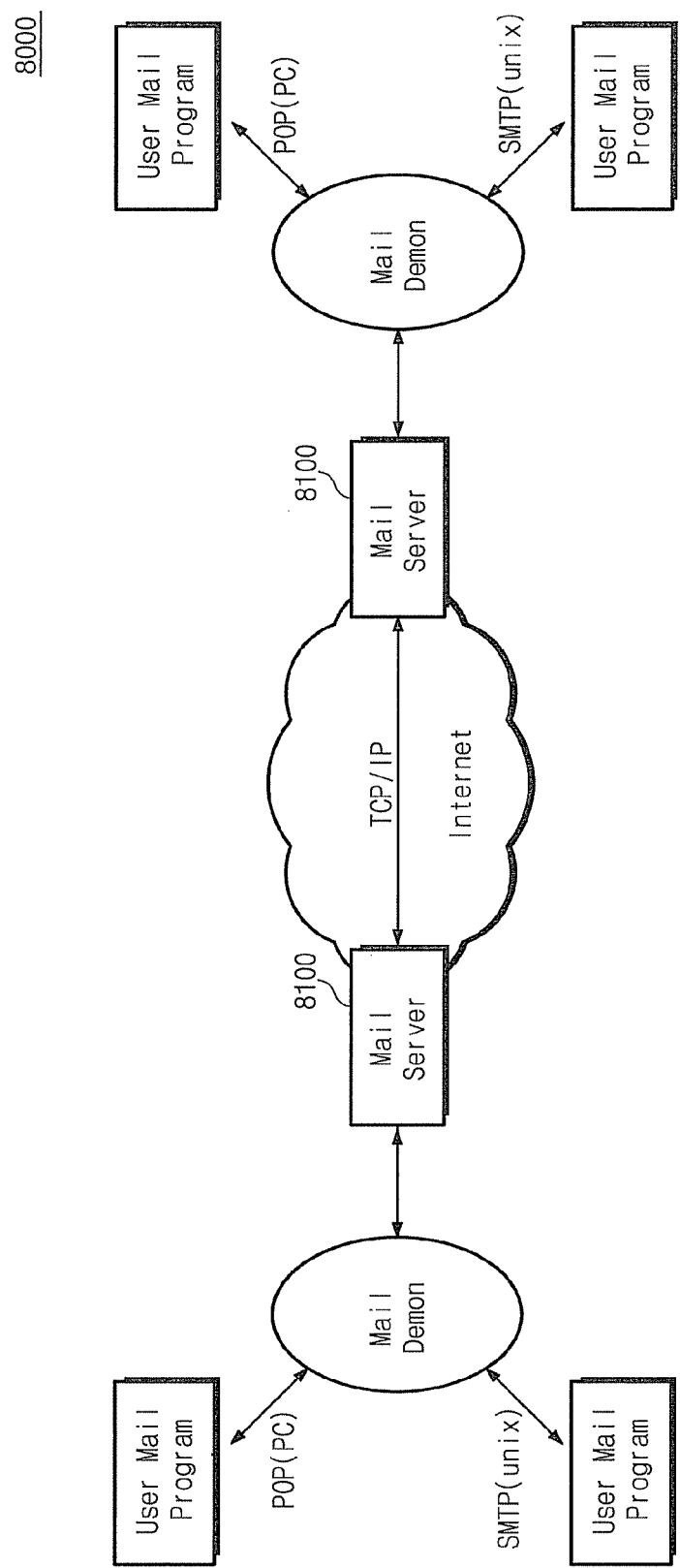

FIGS. 20-22 are diagrams illustrating systems to which a data storage device according to example embodiments of the inventive concept may be applied. In the event that a solid state drive that may include a data storage device according to example embodiments may be applied to the storage, as illustrated in FIG. 20, a system 6000 may include a storage 6100 which may communicate with a host by a wire and/or wireless manner. In a case where a solid state drive may include a data storage device according to example embodiments may be applied to a storage server, as illustrated in FIG. 21, a system 7000 may include storage servers 7100 and 7200 which may communicate with a host by a wire and/or wireless manner. As illustrated in FIG. 22, a solid state drive that may include a data storage device according to example embodiments may be applied to a mail server 8100. The mail server 8100 may communicate with user mail programs via a mail demon that may be connected in POP and SMTP manners. Mail servers 8100 may communicate via an internet network.

Figure 23:
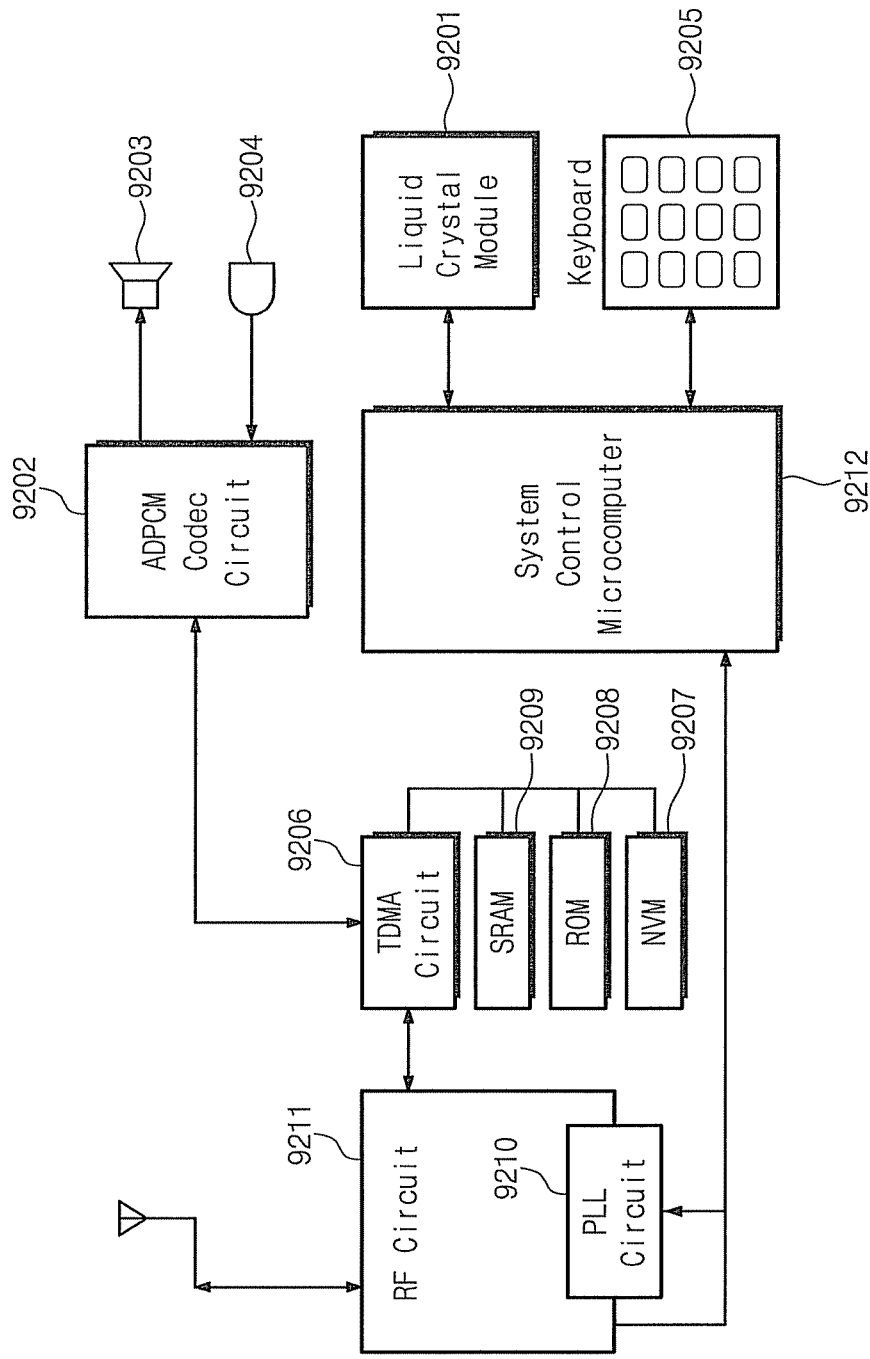

FIGS. 23-27 are diagrams illustrating other systems to which a data storage device according to example embodiments of the inventive concepts may be applied. FIG. 23 is a block diagram illustrating cellular phone systems according to at least one example embodiment. Referring to FIG. 23, a cellular phone system may include an ADPCM codec circuit 9202 that may compress a voice and decompress a compressed voice, a speaker 9203, a microphone 9204, a TDMA circuit 9206 for time-division multiplexing digital data, a PLL circuit 9210 that may be configured to set a carrier frequency of a radio frequency signal, an RF circuit 9211 that may be configured to send and receive a radio frequency signal, and the like. The cellular phone system may include input/output devices, for example, a liquid crystal module 9201 and a keyboard 9205.

The cellular phone system may include various types of memories, for example, a nonvolatile memory device 9207, ROM 9208 and SRAM 9209. The nonvolatile memory device 9207 may be a nonvolatile memory device which may include a memory block storing ROM data and replica ROM data according to example embodiments described with respect to FIGS. 1-14. One memory block may be used to store ROM data and replica ROM data. It may be possible to reduce the number of memory blocks that may be related to ROM data by storing ROM data and replica ROM data using only one memory block. The ROM 9208 may be used to store programs, and the SRAM 9209 may be used as a work region for the system control microcomputer 9212 and/or to temporarily store data. Herein, the system control microcomputer 9212 may be a processor which may be configured to control write and/or read operations of the nonvolatile memory device 9207.

Figure 24:
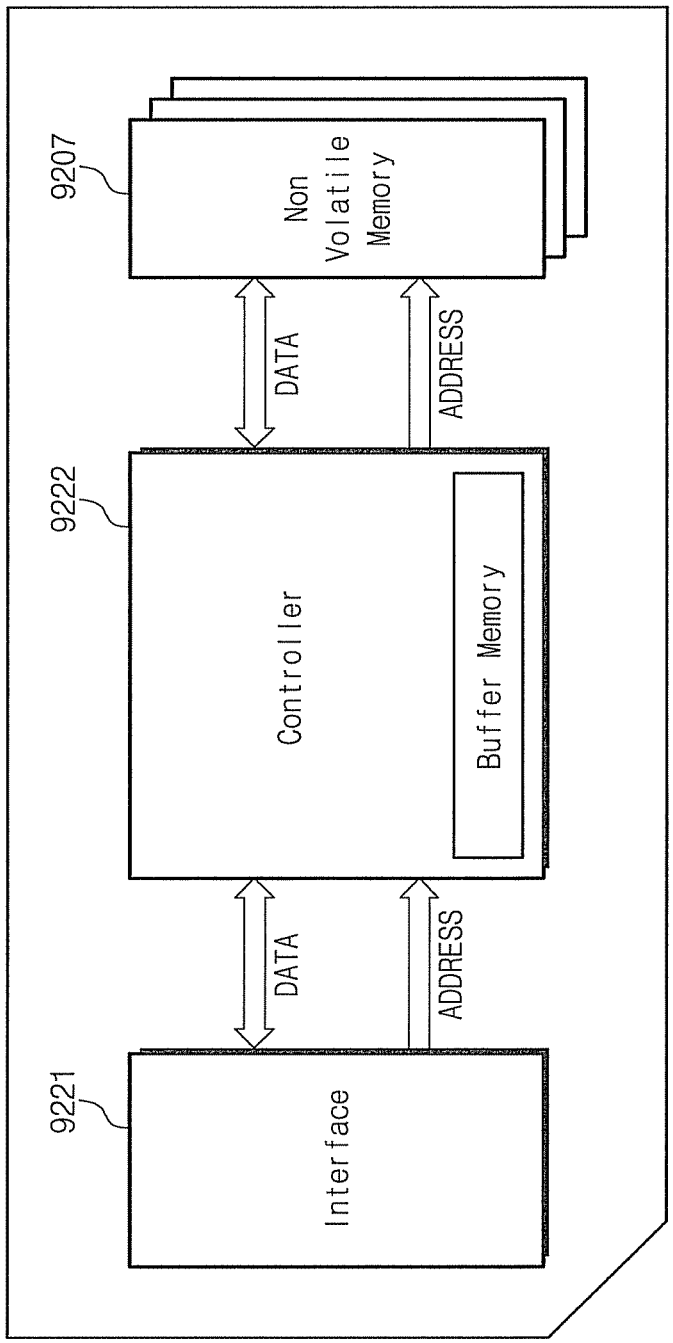

FIG. 24 is a block diagram illustrating memory cards according to example embodiments of the inventive concepts. A memory card, for example, may be an MMC card, an SD card, a multiuse card, a micro-SD card, a memory stick, a compact SD card, an ID card, a PCMCIA card, an SSD card, a chip-card, a smartcard, an USB card, and/or the like.

Referring to FIG. 24, a memory card may include an interface circuit 9221 for interfacing with an external device, a controller 9222 that may include a buffer memory and that may control an operation of the memory card, and at least one nonvolatile memory device 9207 according to at least one example embodiment, for example, as described with respect to FIGS. 1-14. The nonvolatile memory device 9207 may be a nonvolatile memory device 1000 which may include a memory block storing ROM data and replica ROM data. One memory block may be used to store ROM data and replica ROM data. It may be possible to reduce the number of memory blocks related to ROM data by storing ROM data and replica ROM data using only one memory block. The controller 9222 may be a processor which may be configured to control write and/or read operations of the nonvolatile memory device 9207. The controller 9222 may be coupled with the nonvolatile memory device 9207 and the interface circuit 2221 via a data bus and/or an address bus.

Figure 25:
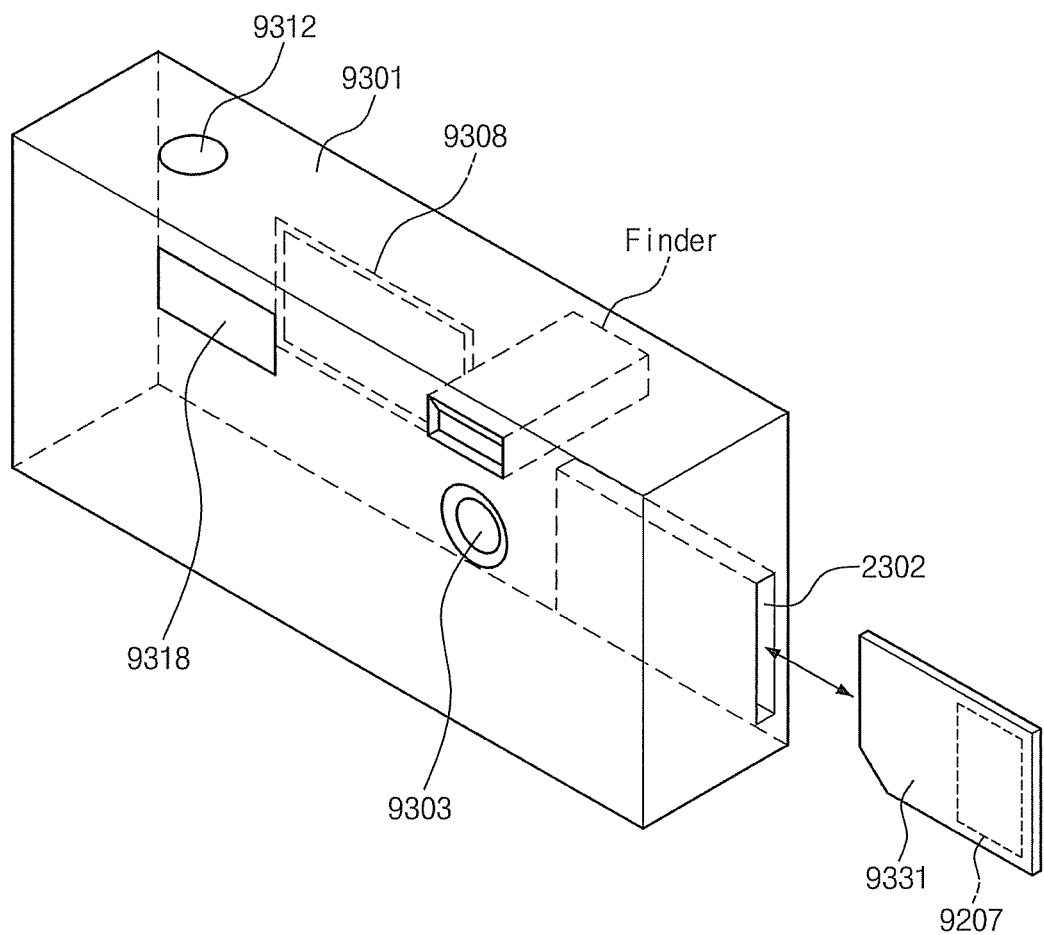

FIG. 25 is a block diagram illustrating digital still cameras according to at least one example embodiment of the inventive concepts. Referring to FIG. 25, a digital still camera may include a body 9301, a slot 2302, a lens 9303, a display circuit 9308, a shutter button 9312, a strobe 9318, a view finder Finder and/or the like. A memory card 9331 may be inserted in the slot 2302 and may include at least one nonvolatile memory device 9207 according to example embodiments. The nonvolatile memory device 9207 may be formed of a nonvolatile memory device 1000 which may include a memory block storing ROM data and replica ROM data. One memory block may be used to store ROM data and replica ROM data. It may be possible to reduce the number of memory blocks related to ROM data by storing ROM data and replica ROM data using only one memory block. If the memory card 9331 is a contact type, an electric circuit on a circuit board may be electrically contacted with the memory card 9331 when it may be inserted in the slot 9308. In the event that the memory card 9331 may be a non-contact type, an electric circuit on a circuit board may communicate with the memory card 9331 in a radio-frequency manner.

Figure 26:
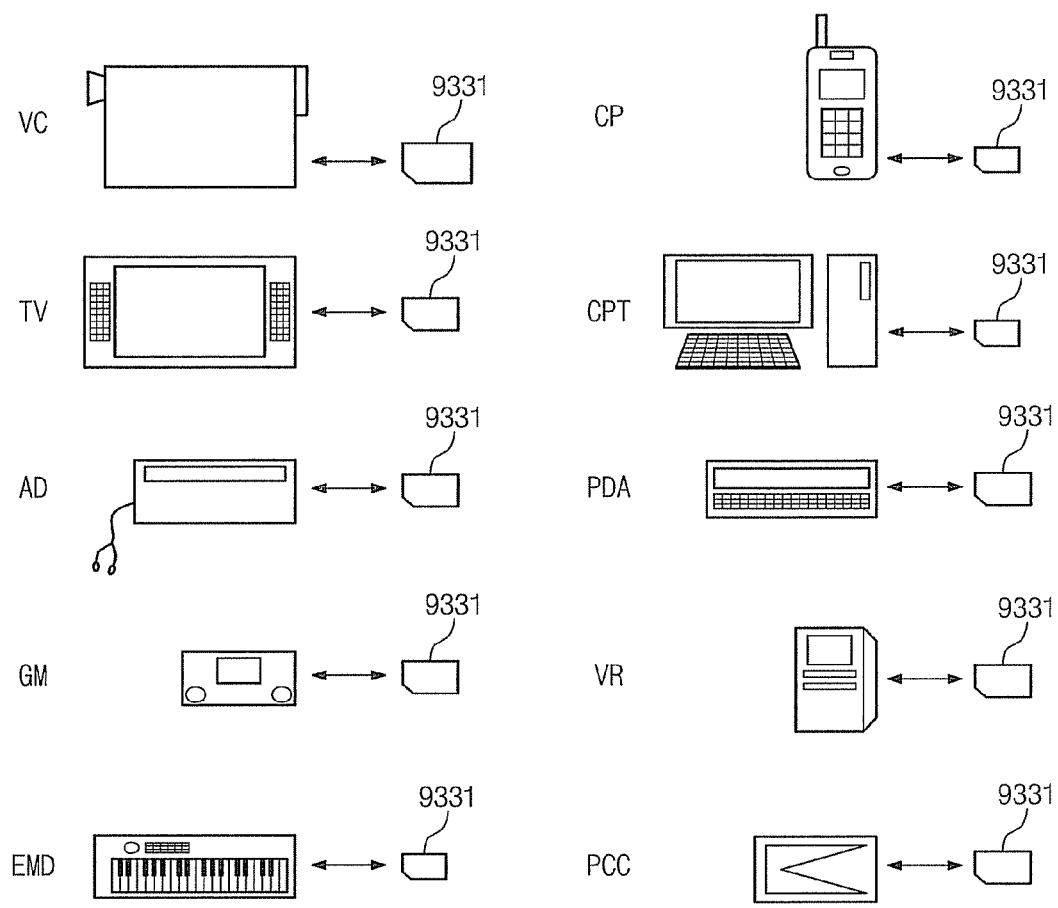

FIG. 26 is a diagram illustrating various systems to which a memory card in FIG. 23 may be applied. Referring to FIG. 26, a memory card 9331 may be applied to a video camera VC, a television TV, an audio device AD, a game machine GM, an electronic music device EMD, a cellular phone CP, a computer CPT, a personal digital assistant PDA, a voice recorder VR, a PC card PCC, and/or the like.

Figure 27:
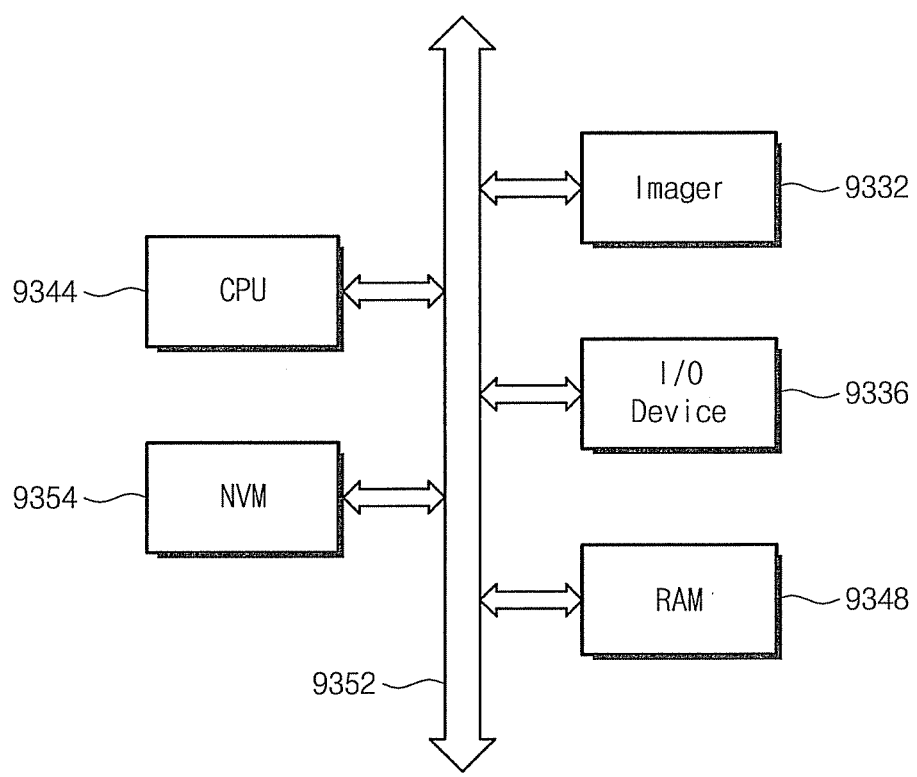

FIG. 27 is a block diagram illustrating image sensor systems according to an example embodiment. Referring to FIG. 27, an image sensor system may include an image sensor 9332, an input/output device 9336, RAM 9348, CPU 9344, and/or a nonvolatile memory device 9354 according to at least one example embodiment. The nonvolatile memory device 9354 may be a nonvolatile memory device 1000 which may include a memory block storing ROM data and replica ROM data. One memory block may be used to store ROM data and replica ROM data. It may be possible to reduce the number of memory blocks related to ROM data by storing ROM data and replica ROM data using only one memory block. Elements in FIG. 27, that is, the image sensor 9332, the input/output device 9336, the RAM 9348, the nonvolatile memory device 9354 may communicate with one another via a bus 9352. The image sensor 9332 may include a photo sensing device, for example, a photo-gate, photo-diode, and/or the like. Elements in FIG. 27 may be a single chip together with a processor and/or independent from the processor.

A nonvolatile memory device and/or a controller may be packed by various types of packages such as PoP(Package on Package), Ball grid arrays(BGAs), Chip scale packages(C-SPs), Plastic Leaded Chip Carrier(PLCC), Plastic Dual In-Line Package(PDIP), Die in Waffle Pack, Die in Wafer Form, Chip On Board(COB), Ceramic Dual In-Line Package(CER-DIP), Plastic Metric Quad Flat Pack(MQFP), Thin Quad Flat-pack(TQFP), Small Outline(SOIC), Shrink Small Outline Package(S SOP), Thin Small Outline(TSOP), System In Package(SIP), Multi Chip Package(MCP), Wafer-level Fabricated Package(WFP), Wafer-Level Processed Stack Package(WSP), and/or the like.

While example embodiments have been particularly shown and described, it will be understood by one of ordinary skill in the art that variations in form and detail may be made therein without departing from the spirit and scope of the claims.

What is claimed is:

1. A nonvolatile memory device, comprising:
a memory cell array including a plurality of memory blocks on a substrate, each of the plurality of memory blocks including strings arranged in rows and columns,
the strings including a plurality of memory cells stacked vertical on each other and on the substrate,
the plurality of memory blocks including at least one memory block including a read-only-memory (ROM) data region and a replica ROM data region,
the ROM data region including first strings of one first row of the rows in the one memory block,
the replica ROM data region including second strings of one second row of the rows in the one memory block,
the first row being different than the second row,
the plurality of memory cells in each of the first strings being connected with word lines,
the word lines including two first word lines and a plurality of second word lines; and
a plurality of bit lines connected to the memory cell array, strings of each of the rows connected with the bit lines, and strings of each of the columns connected in common with a corresponding one of the bit lines, wherein
the nonvolatile memory device is configured to store ROM data in memory cells connected to the two first word lines, and to maintain memory cells connected to the second word lines in an erase state, and
the nonvolatile memory device is configured to, at a read operation, drive the two first word lines using a ground voltage, drive word lines of the second word lines that are adjacent to the two first word lines using a voltage higher than a read voltage, and drive the second word lines other than the adjacent second word lines using the read voltage.

2. The nonvolatile memory device of claim 1, wherein the nonvolatile memory device is configured to execute read and program operations on the first strings independently from the second strings.

3. The nonvolatile memory device of claim 1, wherein at least one of the second word lines is between the two first word lines.

4. The data storage device of claim 1, wherein the memory cells connected to the two first word lines include:
a first group of memory cells at a first height that are connected to one of the two first word lines, and
a second group of memory cells at a second height that are connected to an other of the two first word lines.

5. The data storage device of claim 4, wherein at least one of the second word lines is between the two first word lines.

6. A data storage device, comprising:
a nonvolatile memory device including a memory cell array with a plurality of memory blocks on a substrate, each of the plurality of memory blocks including a plurality of strings arranged in rows and columns,
the strings including a plurality of memory cells stacked vertical on each other and on the substrate,
the plurality of memory blocks including at least one memory block including a read-only-memory ROM data region and a replica ROM data region,
the ROM data region including first strings of one first row of the rows in the one memory block,
the replica ROM data region including second strings of one second row of the rows in the one memory block,
the first row being different than the second row,
the plurality of memory cells in each of the first strings being connected with word lines,
the word lines including two first word lines and a plurality of second word lines;
a plurality of bit lines connected to the memory cell array, strings of each of the rows are connected with the bit lines, and strings of each of the columns are connected in common with a corresponding one of the bit lines; and
a control logic configured to control the nonvolatile memory device, wherein
the nonvolatile memory device is configured to store ROM data in memory cells connected to the two first word lines, and to maintain memory cells connected to the second word lines in an erase state, and
the nonvolatile memory device is configured to, at a read operation, drive the two first word lines using a ground voltage, drive word lines of the second word lines that are adjacent to the two first word lines using a voltage higher than a read voltage, and drive the second word lines other than the adjacent second word lines using the read voltage.

7. The data storage device of claim 6, wherein
strings of each of the rows are connected with the bit lines, and
strings of each of the columns are connected in common with a corresponding one of the bit lines.

8. The data storage device of claim 7, wherein the nonvolatile memory device is configured to execute read and program operations on the first strings independently from the second strings.

9. The data storage device of claim 8, wherein at least one of the second word lines is between the two first word lines.

10. A solid state drive comprising:
the data storage device of claim 6; and
a controller connected with the data storage device via a plurality of channels.

11. The solid state drive of claim 10, wherein
strings of the plurality of strings in each row are connected with the bit lines, and
strings of the plurality of strings in each column are connected in common with a corresponding one of the bit lines.

12. The solid state drive of claim 11, wherein each of the nonvolatile memory devices are configured to execute read and program operations on the first strings independently from the second strings.

13. The solid state drive of claim 12, wherein
each of the nonvolatile memory devices are configured to store ROM data in memory cells connected to the two first word lines, and to maintain an erase state in memory cells connected to the second word lines, and
at least one of the second word lines is between the two first word lines.

14. The data storage device of claim 6, wherein the memory cells connected to the two first word lines include:
a first group of memory cells at a first height that are connected to one of the two first word lines, and
a second group of memory cells at a second height that are connected to an other of the two first word lines.

15. The data storage device of claim 14, wherein at least one of the second word lines is between the two first word lines.

16. A nonvolatile memory device, comprising:
memory block configured to store read-only-memory (ROM) data and replica ROM data,
the one memory block including a plurality of memory cell strings arranged in rows and columns,
each of the memory cell strings including at least three vertically stacked memory cells that are each connected to a word line,
the memory block being configured to store read-only-memory (ROM) data in memory cells connected to two first word lines in a first row among the rows of memory cell strings of the memory block,
the memory block being configured to maintain an erase state in memory cells connected to second word lines in the first row among the rows of memory cell strings,
the memory block being configured to store replica ROM data in a second row among the rows of memory cell strings of the memory block,
the first row and the second row being different,
wherein the nonvolatile memory device is configured to, at a read operation,
drive the two first word lines using a ground voltage,
drive word lines of the second word lines that are adjacent to the two first word lines using a voltage higher than a read voltage, and
drive the second word lines other than the adjacent second word lines using the read voltage.

17. The nonvolatile memory device of claim 16, wherein the memory block is one of a plurality of memory blocks in a memory cell array.

18. The nonvolatile memory device of claim 17, wherein the nonvolatile memory device is configured to read and repair the ROM data using only the one memory block.

19. The data storage device of claim 16, wherein at least one of the second word lines is between the two first word lines.

20. The data storage device of claim 16, wherein the memory cells connected to the two first word lines include:
a first group of memory cells at a first height that are connected to one of the two first word lines, and
a second group of memory cells at a second height that are connected to an other of the two first word lines.

21. The data storage device of claim 20, wherein at least one of the second word lines is between the two first word lines.

* * * * *